(12) United States Patent
Nishiyama et al.

(10) Patent No.: US 10,838,278 B2
(45) Date of Patent: Nov. 17, 2020

(54) LIQUID CRYSTAL DISPLAY DEVICE

(71) Applicant: Sharp Kabushiki Kaisha, Sakai (JP)

(72) Inventors: Takayuki Nishiyama, Sakai (JP); Ryo Yonebayashi, Sakai (JP); Kohhei Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/495,459

(22) PCT Filed: Mar. 28, 2018

(86) PCT No.: PCT/JP2018/012663
§ 371 (c)(1),
(2) Date: Sep. 19, 2019

(87) PCT Pub. No.: WO2018/181435
PCT Pub. Date: Oct. 4, 2018

(65) Prior Publication Data
US 2020/0064669 A1    Feb. 27, 2020

(30) Foreign Application Priority Data

Mar. 30, 2017  (JP) .................................. 2017-068988

(51) Int. Cl.
*G02F 1/1368*     (2006.01)
*G02F 1/1345*     (2006.01)
(Continued)

(52) U.S. Cl.
CPC ........ *G02F 1/1368* (2013.01); *G02F 1/13454* (2013.01); *G02F 1/136286* (2013.01);
(Continued)

(58) Field of Classification Search
CPC ...... G02F 1/155; G02F 1/0316; G02F 1/1343; G02F 1/136227; G02F 1/136286;
(Continued)

(56) References Cited

U.S. PATENT DOCUMENTS 10,535,313 B2 *  1/2020  Hong .................. G09G 3/3677
2004/0183768 A1    9/2004  Yamato et al.
(Continued)

FOREIGN PATENT DOCUMENTS

JP    2004-287087 A    10/2004
JP    2008-164952 A    7/2008
(Continued)

*Primary Examiner* — Dung T Nguyen
(74) *Attorney, Agent, or Firm* — Keating & Bennett, LLP

(57) ABSTRACT

Provided is a technique for decreasing the deterioration of the display quality, while reducing electric power consumption. An active matrix substrate includes a plurality of gate lines Gn, Gn+1, a plurality of source lines S, a plurality of pixels PIX that are provided with pixel electrodes 11, respectively, and pixel switching elements 12 each of which is connected with the pixel electrode 11, the gate line, and the source line. The pixel electrode 11 has a connection portion 11*b* to which the pixel switching element 12 is connected. The connection portion 11*b* extends to an adjacent one of the pixels that is adjacent to the pixel where the pixel electrode 11 is provided, in a gate line extending direction. A data signal supplied by a source line has a polarity that is opposite to a polarity of a data signal supplied by an source line adjacent to the source line, and that is inverted every vertical period.

7 Claims, 14 Drawing Sheets

(51) Int. Cl.
*G02F 1/1362* (2006.01)
*G02F 1/1333* (2006.01)
*G02F 1/1335* (2006.01)
*G02F 1/1343* (2006.01)
*G06F 3/041* (2006.01)
*G06F 3/044* (2006.01)
*G09G 3/36* (2006.01)
*H01L 27/12* (2006.01)

(52) U.S. Cl.
CPC .... *G02F 1/13338* (2013.01); *G02F 1/133512* (2013.01); *G02F 1/134309* (2013.01); *G02F 1/136213* (2013.01); *G02F 2201/40* (2013.01); *G06F 3/044* (2013.01); *G06F 3/0412* (2013.01); *G09G 3/3614* (2013.01); *G09G 3/3648* (2013.01); *G09G 2300/0426* (2013.01); *G09G 2310/08* (2013.01); *G09G 2330/023* (2013.01); *H01L 27/124* (2013.01); *H01L 27/1225* (2013.01)

(58) Field of Classification Search
CPC ........... G02F 1/13454; G02F 1/134309; G02F 2001/1357
See application file for complete search history.

(56) References Cited

U.S. PATENT DOCUMENTS

| | | |
|---|---|---|
| 2008/0158125 A1 | 7/2008 | Mori et al. |
| 2015/0293546 A1 | 10/2015 | Tanaka et al. |
| 2016/0011476 A1* | 1/2016 | Park .................. G02F 1/134309 349/47 |
| 2017/0023833 A1* | 1/2017 | No ..................... G02F 1/134309 |
| 2017/0255049 A1 | 9/2017 | Nishiyama et al. |

FOREIGN PATENT DOCUMENTS

| | | |
|---|---|---|
| WO | 2014/069529 A1 | 5/2014 |
| WO | 2016/080541 A1 | 5/2016 |

\* cited by examiner

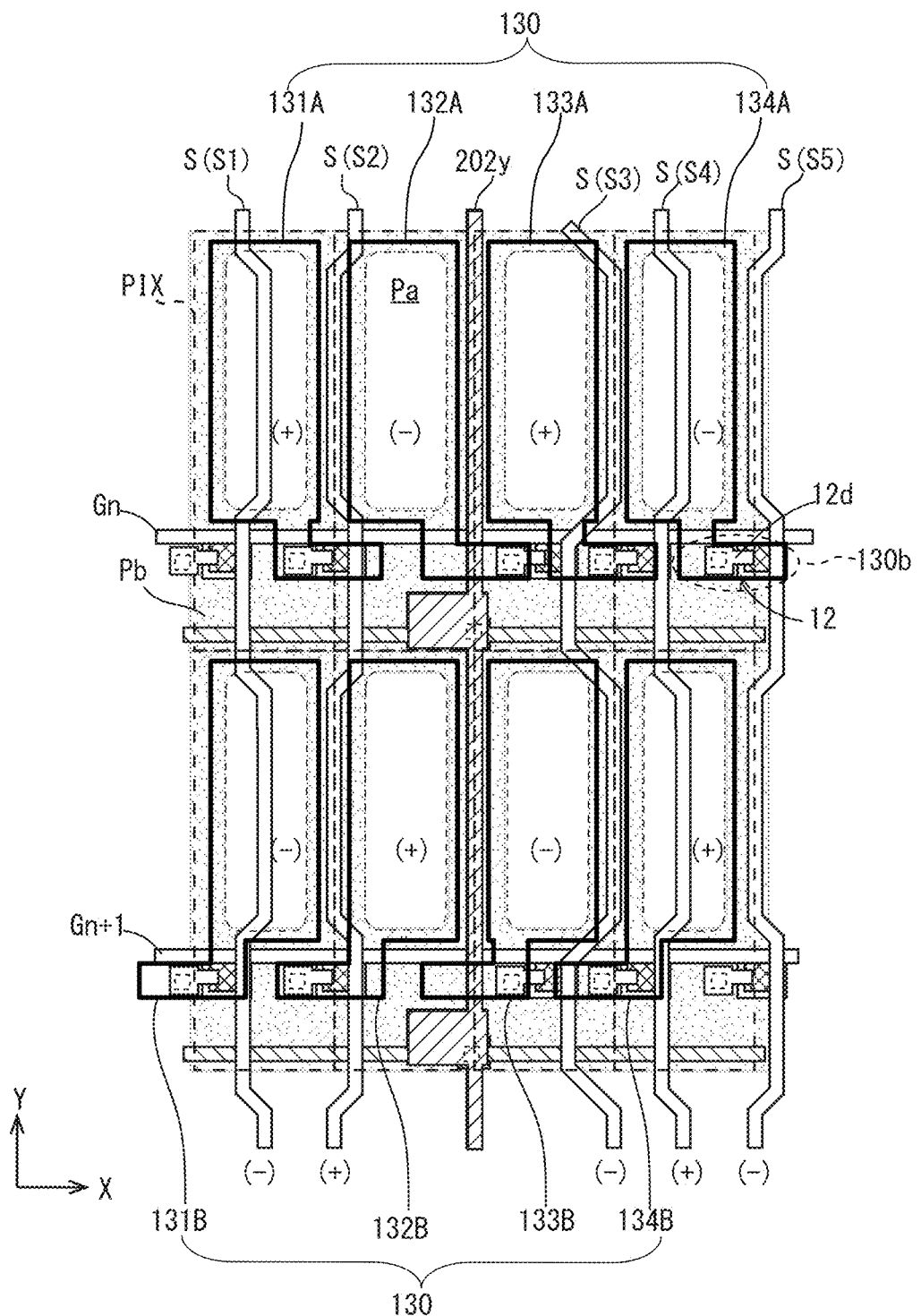
F I G. 11

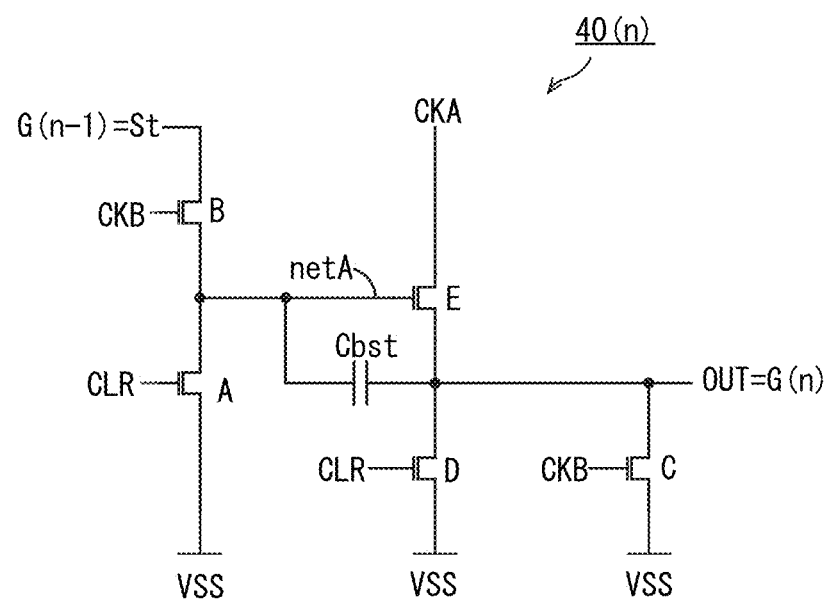
F I G. 1 3

LIQUID CRYSTAL DISPLAY DEVICE

TECHNICAL FIELD

The present invention relates to a liquid crystal display device.

BACKGROUND ART

Conventionally, a technique for driving a liquid crystal display device with use of alternate current signals in order to decrease the deterioration of liquid crystal in a liquid crystal display device has been known. As a method for driving a liquid crystal display device with use of alternate current signals, for example, the following methods have been proposed: frame inversion driving in which the polarity of a pixel voltage with respect to the potential of a common electrode as a reference is inverted between a positive polarity and a negative polarity at every frame; line inversion driving in which the polarity of a pixel voltage is inverted at every horizontal scanning line; and dot inversion driving in which the polarity of a pixel voltage is inverted at every dot (see, for example, JP-A-2004-287087 and JP-A-2008-164952).

SUMMARY OF THE INVENTION

In the case of frame inversion driving, where flicker tends to occur, or line inversion driving, where lines such as those in a horizontal strip pattern tend to occur, it is likely that the deterioration of the display quality would occur. On the other hand, it is unlikely that dot inversion driving would result in such deterioration of the display quality. Dot inversion driving can be achieved by inverting the polarity of a data signal voltage supplied to the source line every horizontal scanning period, but this increases electric power consumption for inverting the polarity of the data signal voltage.

It is an object of the present invention to provide a technique for decreasing the deterioration of the display quality, while reducing electric power consumption.

A liquid crystal display device according to the present invention is a liquid crystal display device that includes: an active matrix substrate; a counter substrate that is arranged so as to be opposed to the active matrix substrate; a liquid crystal layer interposed between the active matrix substrate and the counter substrate; and a circuit that supplies data signals to the active matrix substrate. The active matrix substrate includes: a plurality of gate lines; a plurality of source lines that intersect with the gate lines, and supply the data signals; a plurality of pixels that are provided with pixel electrodes, respectively; and pixel switching elements each of which is connected, in each of the pixels, with the pixel electrode of the said pixel, one of the gate lines, and one of the source lines, wherein the pixel electrode has a connection portion that is connected with the pixel switching element, the connection portion of the pixel electrode extends to an adjacent one of the pixels that is adjacent in a gate line extending direction to the pixel where the said pixel electrode is provided, and the data signal supplied by a source line has a polarity that is opposite to a polarity of a data signal supplied by a source line adjacent to the source line, and that is inverted every vertical scanning period.

With the configuration of the present invention, the deterioration of the display quality can be decreased, while electric power consumption can be reduced.

BRIEF DESCRIPTION OF DRAWINGS

FIG. 11 is a schematic diagram showing an exemplary configuration of pixels in Embodiment 3.

FIG. 13 is an exemplary equivalent circuit diagram of the gate driver shown in FIG. 12.

MODE FOR CARRYING OUT THE INVENTION

Figure 1:
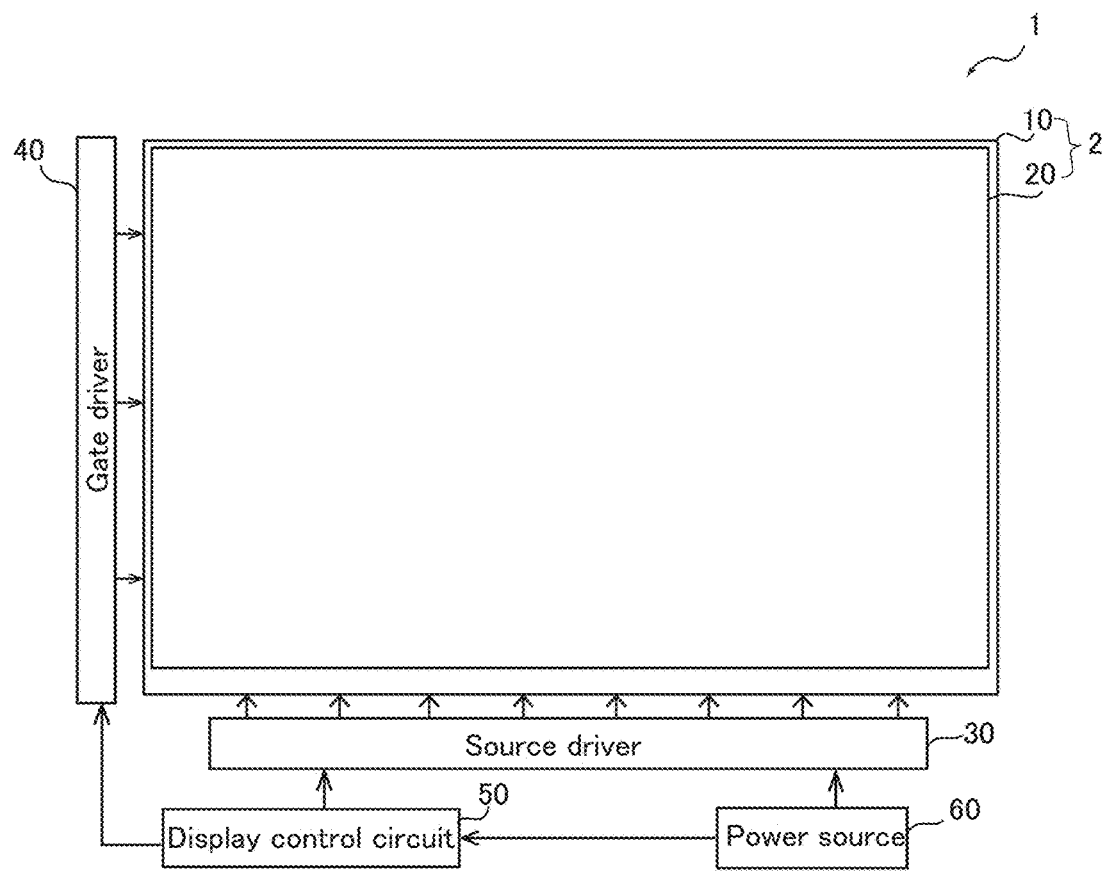
FIG. 1 is a schematic diagram showing a schematic configuration of a liquid crystal display device according to Embodiment 1.

A liquid crystal display device according to one embodiment of the present invention is a liquid crystal display device that includes: an active matrix substrate; a counter substrate that is arranged so as to be opposed to the active matrix substrate; a liquid crystal layer interposed between the active matrix substrate and the counter substrate; and a circuit that supplies data signals to the active matrix substrate. The active matrix substrate includes: a plurality of gate lines; a plurality of source lines that intersect with the gate lines, and supply the data signals; a plurality of pixels that are provided with pixel electrodes, respectively; and pixel switching elements each of which is connected, in each of the pixels, with the pixel electrode of the said pixel, one of the gate lines, and one of the source lines, wherein the pixel electrode has a connection portion that is connected with the pixel switching element, the connection portion of the pixel electrode extends to an adjacent one of the pixels that is adjacent in a gate line extending direction to the pixel where the said pixel electrode is provided, and the data signal supplied by a source line has a polarity that is opposite to a polarity of a data signal supplied by a source line adjacent to the source line, and that is inverted every vertical scanning period (the first configuration).

The first configuration makes it easier to connect the pixel electrodes via the pixel switching elements to the source lines according to the polarities of the pixel voltages of the pixel electrode so that the polarities of adjacent ones of the pixel electrodes are opposite to each other, as compared with a case where the connection portion of the pixel electrode does not extend in the gate line extending direction to the adjacent pixel. Therefore, dot inversion driving is realized while electric power consumption is reduced, whereby the deterioration of the display quality can be decreased.

The first configuration may be further characterized in that directions in which the connection portions of adjacent ones of the pixel electrodes that are adjacent in a source line extending direction extend are opposite to each other, and the connection portion of each pixel electrode is connected with the source line closest to the connection portion, among the source lines (the second configuration).

In the second configuration, "the source line closest to the connection portion, to which the connection portion of the pixel electrode is connected" encompasses a source line at the shortest distance from the connection portion, and a source line arranged so as to overlap with the connection portion. According to this configuration, the connection portions of the pixel electrodes adjacent in the source line extending direction extend in directions opposite to each other, respectively. Further, the connection portion of the pixel electrode is arranged so as to reach the pixel that is adjacent thereto in a gate line extending direction. This makes it easier to connect each pixel electrode with the source line to which a data signal is supplied, the data signal having a polarity different from that of other pixel electrodes adjacent on the upper, lower, left, and right sides to the concerned pixel electrode.

The first or second configuration may be further characterized in that the pixel electrodes of the pixels are arranged in matrix, the source lines are aligned at intervals of two adjacent columns of the pixels in the gate line extending direction; the gate lines are arranged in such a manner that two of the gate lines correspond to the pixel electrodes arranged in one same row, and adjacent ones of the pixel electrodes in the one same row that are adjacent with one of the source lines being interposed therebetween are connected to one same gate line of the said two gate lines; and one of the two adjacent ones of the pixel electrodes between which one of the source lines is interposed is connected with the said one of the source lines, and the other one of the adjacent ones of the pixel electrodes is connected with another one of the source lines that is adjacent to the said one of the source lines (the third configuration).

According to the third configuration, the gate lines are provided in such a manner that two gate lines are provided with respect to one row of pixel electrodes, which makes it required to drive the gate line at a double speed as compared with a case where the gate lines are provided in such a manner that one gate line is provided with respect to one row of pixel electrodes. However, it is possible to write data to two columns of pixels with one source line, which makes it possible to reduce the number of source lines. Further, the connection portion of the pixel electrode is arranged so as to reach the pixel that is adjacent thereto in the gate line extending direction. This therefore makes it easier to connect the pixel electrode with the source line corresponding to the polarity of the pixel voltage of the pixel electrode, even in a case where the source lines are arranged at intervals of two columns of the pixels. This makes it possible to realize dot inversion driving with low electric power consumption.

The third configuration may be further characterized by further including: a common electrode arranged so as to be opposed to the pixel electrodes of the pixels; and a signal line connected with the common electrode, wherein the signal line is arranged in a space between two columns of the pixels, no source line being arranged in the space (the fourth configuration).

The fourth configuration allows dot inversion driving to be performed with low electric power consumption, and makes it easier to arrange, within the pixels, the signal line connected with the common electrode. Besides, by arranging the signal line, the resistance of the common electrode can be reduced.

The first configuration may be further characterized by further including: driving circuits that are provided with respect to the gate lines, respectively, each driving circuit switching a corresponding one of the gate lines into a selected state or a non-selected state; and a plurality of control lines that are connected with the driving circuits, respectively, and supply a control signal, wherein the driving circuit includes a driving circuit element including a plurality of switching elements; the driving circuit element is arranged in a plurality of the pixels that are adjacent in a gate line extending direction; one of the source lines connected with the pixel electrode of one of the pixels where the driving circuit element is provided is bent; and the control line connected to the driving circuit element is arranged in a space between the pixels where the driving circuit element is arranged (the fifth configuration).

The fifth configuration allows dot inversion driving to be realized with low electric power consumption, and makes it easier to arrange the driving circuit elements and the control lines within the pixels, as compared with a case where all of the source lines are straight.

The fifth configuration may be further characterized in that the switching elements as the driving circuit elements contain an oxide semiconductor containing indium (In), gallium (Ga), zinc (Zn), and oxygen (O) as a semiconductor material (the sixth configuration).

With the sixth configuration, the pixels in which the driving circuit elements are arranged are allowed to have a greater aperture ratio, as compared with a case where amorphous silicon (a-Si), low temperature poly-silicon (LTPS), or the like is used as a semiconductor material for forming the switching elements as the driving circuit elements.

Any one of the first to sixth configurations may be further characterized in that the pixel switching elements contain an oxide semiconductor containing indium (In), gallium (Ga), zinc (Zn), and oxygen (O) as a semiconductor material (the seventh configuration).

With the seventh configuration, the pixels are allowed to have image definition enhancement, as compared with a case where amorphous silicon (a-Si), low temperature poly-silicon (LTPS), or the like is used as a semiconductor material for forming the pixel switching elements.

Any one of the first to seventh configurations may be further characterized in that drains of the pixel switching elements are arranged on the same side with respect to the source lines to which the pixel switching elements are connected (the eighth configuration).

With the eighth configuration, the capacitances between the pixel electrodes and the gate lines vary equally, even in a case where the gate layer and the source layer are displaced from each other in the gate line extending direction. Therefore, the pull-in voltages of the pixels when the pixel switching elements are turned OFF are also equal, which makes it unlikely that display defects would occur.

The following description describes embodiments of the present invention in detail, while referring to the drawings. Identical or equivalent parts in the drawings are denoted by the same reference numerals, and the descriptions of the same are not repeated.

Embodiment 1

FIG. 1 schematically shows a schematic configuration of a liquid crystal display device according to the present embodiment. The liquid crystal display device 1 includes a display panel 2. The display panel 2 includes an active matrix substrate 10, a counter substrate 20, a liquid crystal layer (not shown) interposed between these substrates, and a pair of polarizing plates between which the active matrix substrate 10 and the counter substrate 20 are interposed. Further, the liquid crystal display device 1 includes a source driver 30, a gate driver 40, a display control circuit 50, and a power source 60.

As shown in FIG. 1, the active matrix substrate 10 is electrically connected with the source driver 30 and the gate driver 40. Further, the display control circuit 50 is electrically connected with the display panel 2, the source driver 30, and the power source 60. The display control circuit 50 outputs control signals to the source driver 30 and the gate driver 40. The power source 60 is electrically connected with the display panel 2, the source driver 30, and the display control circuit 50, so as to supply a power source voltage signal to each.

Further, the counter substrate 20b is provided with a common electrode, a black matrix (BM), and color filters of three colors, which are red (R), green (G), and blue (B) (all are not shown).

Figure 2:
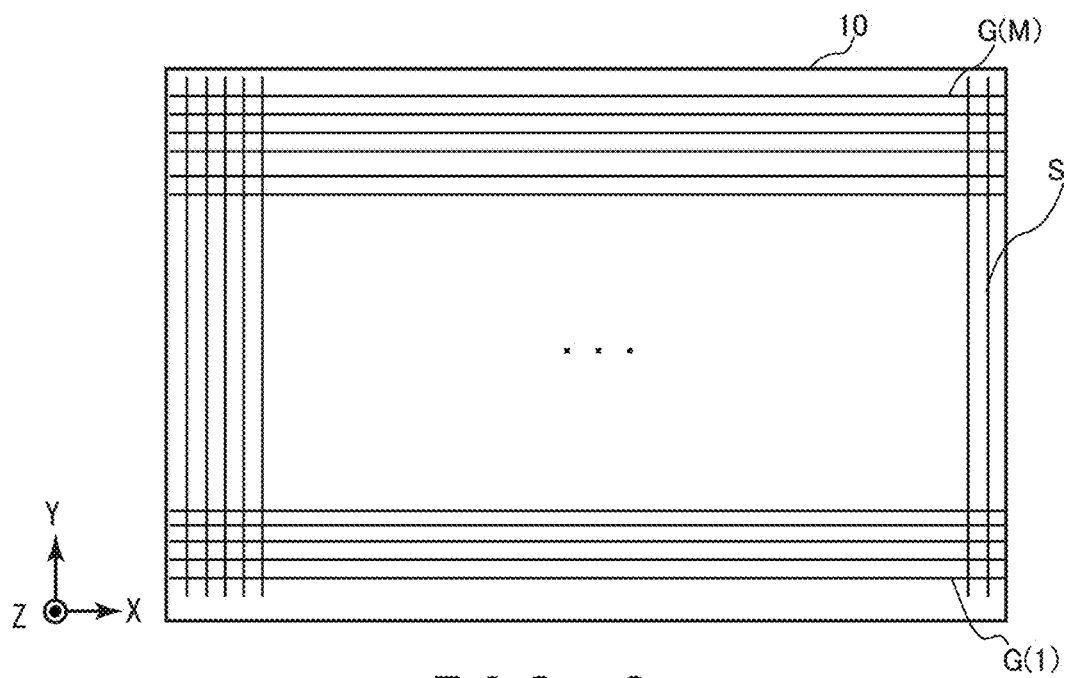
FIG. 2 is a schematic diagram showing a schematic configuration of an active matrix substrate shown in FIG. 1.

FIG. 2 schematically shows a schematic configuration of the active matrix substrate 10. On the active matrix substrate 10, M gate lines G(1) to G(M) (M: a natural number) are formed approximately in parallel at uniform intervals from one end to the other end in the X-axis direction. In the following description, the gate lines are generally referred to as "gate lines G" when the gate lines are not distinguished individually. Further, on the active matrix substrate 10, a plurality of source lines S are formed so as to intersect with each gate line G.

Figure 3:
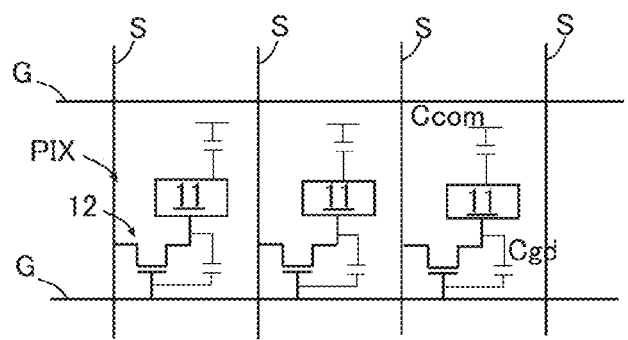
FIG. 3 is an equivalent circuit diagram of a pixel shown in FIG. 2.

FIG. 3 is an equivalent circuit diagram of a pixel formed on the active matrix substrate 10. As shown in FIG. 3, one pixel electrode 11 is arranged in each pixel PIX. The pixel electrode 11 is connected with the gate line G and the source line S via the thin film transistor (TFT) 12 (this TFT is hereinafter referred to as a pixel TFT). Each pixel PIX corresponds to any one of the colors of the color filters on the counter substrate 20.

When the pixel TFT 12 is turned ON, a data signal voltage supplied from the source driver 30 (see FIG. 1) to the source line S is input to the pixel electrode 11 through the pixel TFT 12. To the common electrode (not shown), a predetermined voltage is applied by the display control circuit 50 (see FIG. 1). The potential of the pixel PIX is controlled, depending on a potential of the source line S, a capacitance Cgd between the pixel electrode 11 and the gate line G, and a capacitance Ccom between the pixel electrode 11 and the common electrode (not shown), according to the variation of the potential of the gate line G.

A voltage applied to the pixel electrode 11 is referred to as a pixel voltage. The pixel voltage is a potential of the pixel electrode 11 with respect to the potential of the common electrode. The polarity of the pixel voltage in a case where the potential of the pixel electrode 11 is higher than the potential of the common electrode is assumed to be "positive", and the polarity of the pixel voltage in a case where the potential of the pixel electrode 11 is lower than the potential of the common electrode is assumed to be "negative".

In the present embodiment, dot inversion driving is performed in which the polarity of the pixel voltage of each pixel is opposite to the polarity of the pixel voltages of the pixels adjacent on the upper, lower, right, and left sides to the foregoing pixel. The following description describes a specific configuration for realizing dot inversion driving.

Figure 4:
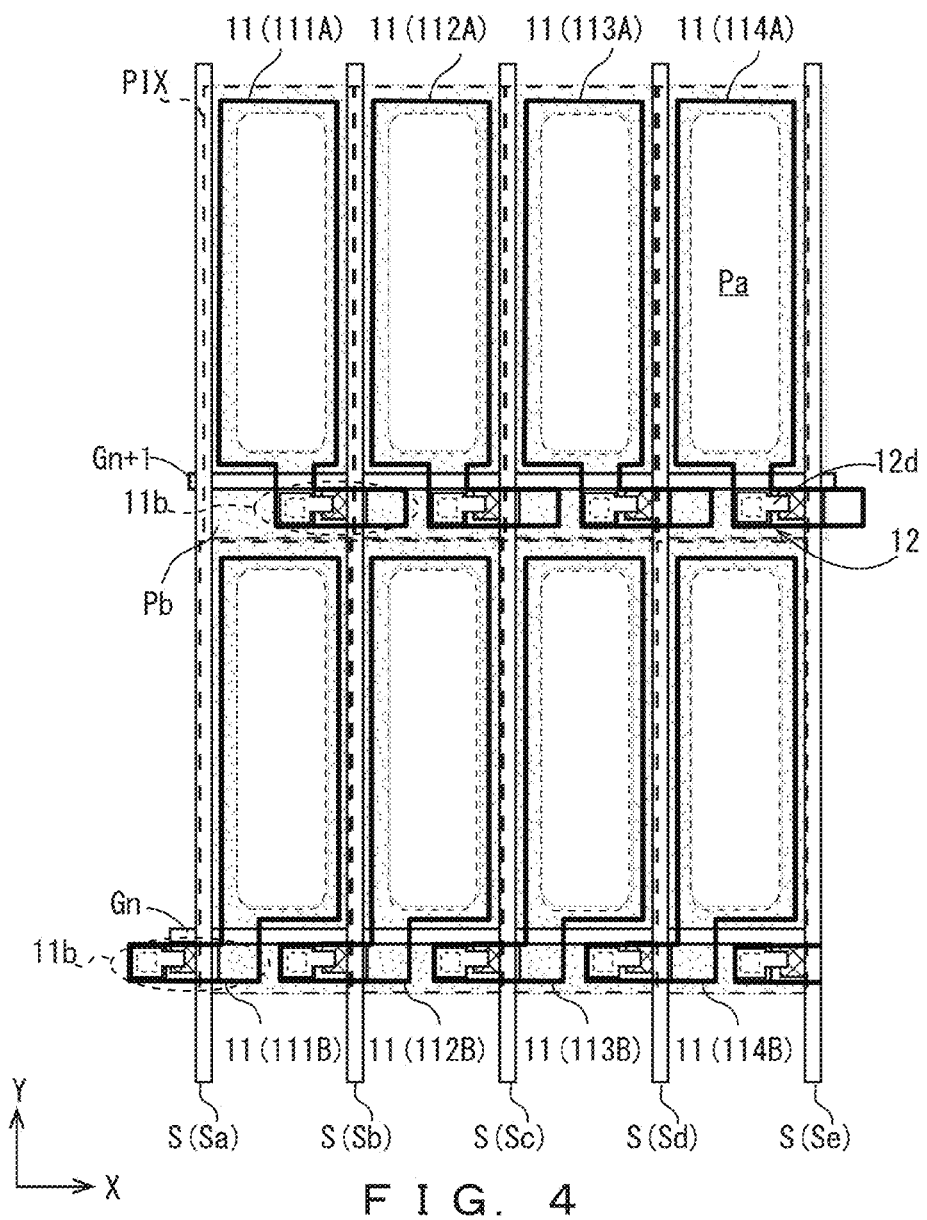
FIG. 4 is a schematic diagram showing a schematic configuration of the pixels in Embodiment 1.

FIG. 4 schematically shows a schematic configuration of pixels in the present embodiment. As shown in FIG. 4, one pixel electrode 11 is arranged in each pixel PIX indicated by a broken line frame. Each pixel PIX has a light-shielding area Pb covered with black matrix (not shown) provided on the counter substrate 20, and a non-light-shielding area Pa (also referred to as an opening) that is not covered with the black matrix. The pixel electrode 11 is connected with the drain 12d of the pixel TFT 12 via a contact. Regarding the pixel TFT 12, the source thereof is connected to the source line S, and the gate thereof is connected to the gate line G.

Figure 5:
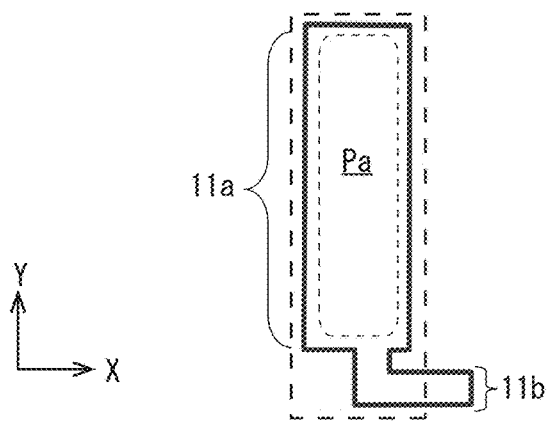
FIG. 5 is a schematic diagram showing a pixel electrode provided in some of the pixels shown in FIG. 4.

Here, the shape of the pixel electrode 11 is described specifically. FIG. 5 schematically shows a pixel electrode 11 provided in some of the pixels PIX shown in FIG. 4. As shown in FIG. 5, the pixel electrode 11 is composed of a capacitor forming portion 11a and a connection portion 11b. The capacitor forming portion 11a is provided in the non-light-shielding area Pa, and forms a capacitor Ccom with the common electrode. The connection portion 11b is a portion that is provided in the light-shielding area Pb and is connected with the drain 12d of the pixel TFT 12 (see FIG. 4) via a contact. Further, the connection portion 11b extends in the X-axis direction with respect to the capacitor forming portion 11a; in other words, it extends so as to reach the light-shielding area Pb of the pixel PIX that is adjacent thereto in the gate line G extending direction. Incidentally, the boundary between the pixels PIX that are adjacent in the gate line G extending direction is located at a position that approximately divides the light-shielding area Pb between the adjacent pixel electrodes 11 into half.

According to this example, as shown in FIG. 4, the connection portions 11b of the pixel electrodes 11 adjacent in the source line S extending direction (the Y-axis direction) extend in directions opposite to each other, respectively. In other words, in FIG. 4, the connection portions 11b of the pixel electrodes 11 (111A to 114A) in the upper row extend in the X-axis positive direction, while the connection portions 11b of the pixel electrodes 11 (111B to 114B) in the lower row extend in the X-axis negative direction.

The pixel electrodes 11 (111A to 114A) in the upper row are connected with the source lines S arranged on the right side to the pixel electrodes 11 via the pixel TFTs 12, and the electrodes 11 (111B to 111b) in the lower row are connected with the source lines S arranged on the left side to the pixel electrodes 11 via the pixel TFTs 12. In other words, each of the pixel electrodes 11 adjacent in the source line S extending direction (the Y-axis direction) is connected with the source line S arranged on a side in the connection portion 11b extending direction with respect to this pixel electrode 11, of the two source lines S adjacent to this pixel electrode 11.

Further, in this example, the drains 12*d* of the pixel TFTs 12 connected to the pixel electrodes 11 in the upper row and the lower low are arranged on the same side with respect to the source lines S.

Figure 6:
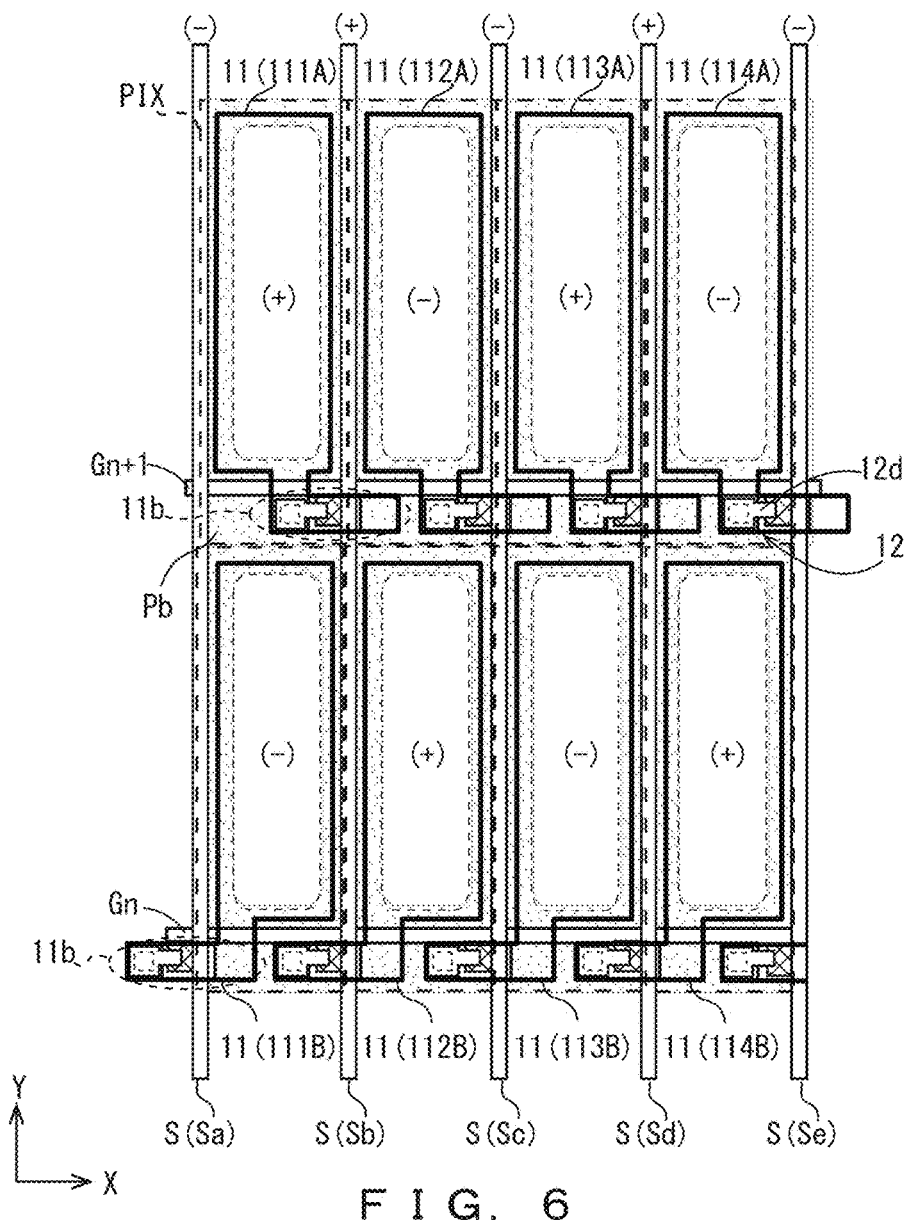
FIG. 6 shows exemplary polarities of data signal voltages supplied to source lines, and exemplary polarities of pixel voltages in a certain frame.

In the example shown in FIG. 4, the data signal voltage supplied to each source line S has a polarity opposite to that of the source line S adjacent thereto, and the polarity of the data signal voltage is inverted every vertical scanning period. FIG. 6 shows an exemplary polarities of data signal voltages supplied to source lines S, and exemplary polarities of pixel voltages at the respective pixels PIX in a certain frame. In FIG. 6, "(+)" indicates that a positive voltage with reference to the voltage of the common electrode is applied, and "(−)" indicates that a negative voltage with reference to the voltage of the common electrode is applied.

As shown in FIG. 6, data signal voltages having a negative polarity are supplied to the source lines Sa, Sc, and Se, and data signal voltages having a positive polarity are supplied to the source lines Sb and Sd. This causes the pixel voltages at the pixel electrodes 111B, 112A, 113B, and 114A connected with the source lines Sa. Sc, and Se to have a negative polarity (−), and causes the pixel voltages at the pixel electrodes 111A, 112B, 113A, and 114B connected with the source lines Sb and Sd to have a positive polarity (+).

Forming the pixel electrode 11 in such a shape makes it possible to connect each pixel electrode 11 with the source line S corresponding to the polarity of the pixel voltage of the pixel PIX where this pixel electrode 11 is provided, thereby causing the pixel voltage of this pixel PIX to be controlled so as to have a polarity opposite to the pixel voltages of other pixels PIX adjacent thereto on the upper, lower, right, and left sides. Dot inversion driving therefore can be achieved by inverting the polarity of a data signal voltage supplied to the source line S every vertical scanning period, which makes it possible to prevent the deterioration of the display quality.

Further, in this example, the pixel TFTs 12 are connected in the same direction to the source lines S. Therefore, even if layer displacement occurs between a gate layer and a source layer, the areas of the parts where the pixel TFTs 12 are connected with the gate lines G and the source lines S are equal. Therefore, even if the gate layer and the source layer are displaced from each other, the capacitances of the pixel electrodes 11 connected to the pixel TFTs 12 and the gate lines G are approximately equal. This makes it unlikely that the pull-in voltages of the pixels when the pixel TFTs 12 are turned OFF would vary, thereby making it unlikely that display defects such as vertical stripe would occur.

Embodiment 2

Embodiment 1 described above is described with reference to an example in which data are written in pixels in one column with use of one source line S, but the present embodiment is described with reference to an example in which data are written in pixels in two columns with use of one source line S.

Figure 7:
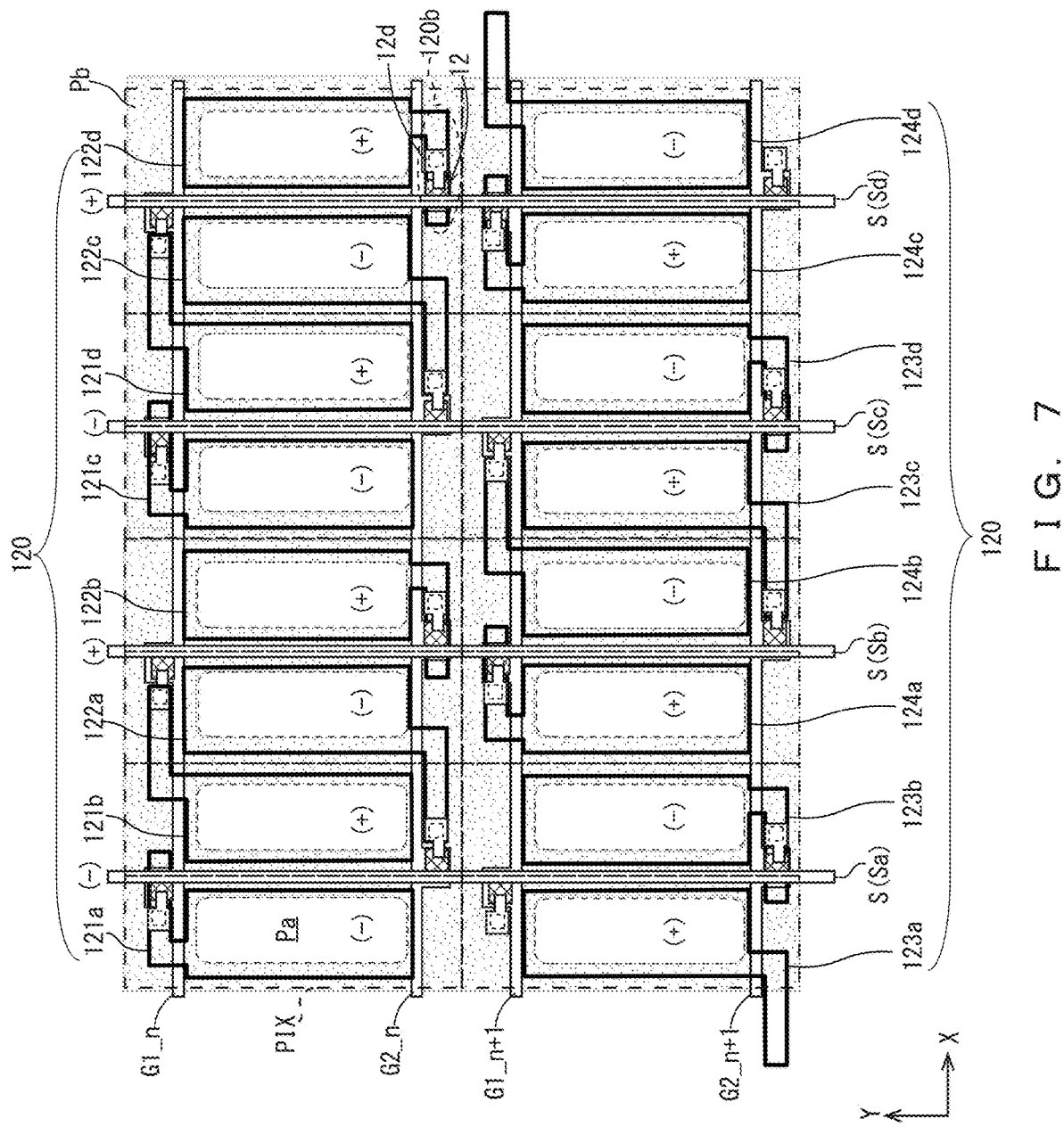
FIG. 7 is a schematic diagram showing a schematic configuration of pixels in Embodiment 2.

FIG. 7 schematically shows a schematic configuration of pixels in the present embodiment. In FIG. 7, members identical to those in Embodiment 1 are denoted by the same reference symbols in Embodiment 1.

As shown in FIG. 7, the source lines S (Sa to Sd) are provided in such a manner that one source line S is provided per two columns of pixels in the present embodiment. In FIG. 7, pixel electrodes 120 (121*a* to 121*d*, 121*a* to 121*d*) are arranged in the upper row, and pixel electrodes 120 (123*a* to 123*d*, 124*a* to 124*d*) are arranged in the lower row. In the upper row, the pixel electrodes 121*a* to 121*d* are connected to the gate line G1_*n*, and the pixel electrodes 122*a* to 122*d* are connected to the gate line G2_*n*. In the lower row, the pixel electrodes 123*a* to 123*d* are connected to the gate line G1_*n*+1, and the pixel electrodes 124*a* to 124*d* are connected to the gate line G2_*n*+1. In other words, in the present example, as two gate lines G are provided with respect to one row of pixels, twice the number of the gate lines G are required, as compared with Embodiment 1.

In the following description, the gate lines G1_*n*, G1_*n*+1, G2_*n*, and G2_*n*+1 are generally referred to as "gate lines G" when they are not distinguished individually. The pixel electrodes 121*a* to 121*d*, 121*a* to 121*d*, 123*a* to 123*d*, and 124*a* to 124D are generally referred to as "pixel electrodes 120" when they are not distinguished individually.

As is the case with Embodiment 1, in the pixel electrode 120, the connection portion 120*b* connected with the drain 12*d* of the pixel TFT 12 extends so as to reach the light-shielding area Pb of the pixel that is adjacent thereto in the gate line G extending direction.

As shown in FIG. 7, the connection portions 120*b* of the pixel electrodes 120 connected with the same gate line G, of the pixel electrodes 120 provided in the same row, extend in the same direction, which is opposite to the direction in which the connection portions 120*b* of the other pixel electrodes 110 are connected with another gate line G. Besides, the connection portions 120*b* of the pixel electrodes 120 adjacent in the Y-axis direction extend in directions opposite to each other.

Further, two adjacent ones of the pixel electrodes 120 connected with the same gate line G are connected with different ones of the source lines S, respectively, the source lines S being close to the connection portions 110*b* of the pixel electrodes 120, respectively. Incidentally, "the source line S close to the connection portion 110*b*" encompasses a source line S at the shortest distance from the connection portion 110*b*, and a source line S arranged so as to overlap with the connection portion 110*b*. In this example, for example, of the pixel electrodes 121*a* and 121*b*, the pixel electrode 121*a* is connected via the pixel TFT 12 with the source line Sa, which is close to the connection portion 120*b* of the pixel electrode 121*a*. On the other hand, the pixel electrode 121*b* is connected via the pixel TFT 12 with the source line Sb, which is close to the connection portion 120*b* of the pixel electrode 121*b*. Besides, for example, of the pixel electrodes 122*a* and 122*b*, the pixel electrode 122*a* is connected via the pixel TFT 12 with the source line Sa, which is close to the connection portion 120*b* of the pixel electrode 122*a*. On the other hand, the pixel electrode 122*b* is connected via the pixel TFT 12 with the source line Sb, which is close to the connection portion 120*b* of the pixel electrode 122*b*.

Besides, the pixel TFTs 12 connected with the same gate line G are connected with the source lines S in the same direction, which is opposite to the direction in which the pixel TFTs 12 adjacent thereto in the Y-axis direction are connected with the source lines S.

In this example, the data signal voltage supplied to each source line S has a polarity opposite to that of the source line S adjacent thereto, and the polarity of the data signal voltage is inverted every vertical scanning period. In other words, as shown in FIG. 7, data signal voltages having a negative polarity (−) are supplied to the source lines Sa and Sc, and data signal voltages having a positive polarity (+) are supplied to the source lines Sb and 15*d*.

This causes the pixel voltages at the pixel electrodes 121a, 122a, 124b, 121c, 123b, 124d, and 122c connected with the source lines Sa and Sc to have a negative polarity (−). This also causes the pixel voltages at the pixel electrodes 121b, 122b, 123a, 124c, 121d, 122d, and 123c connected with the source lines Sb and 15d to have a positive polarity (+).

Figure 8:
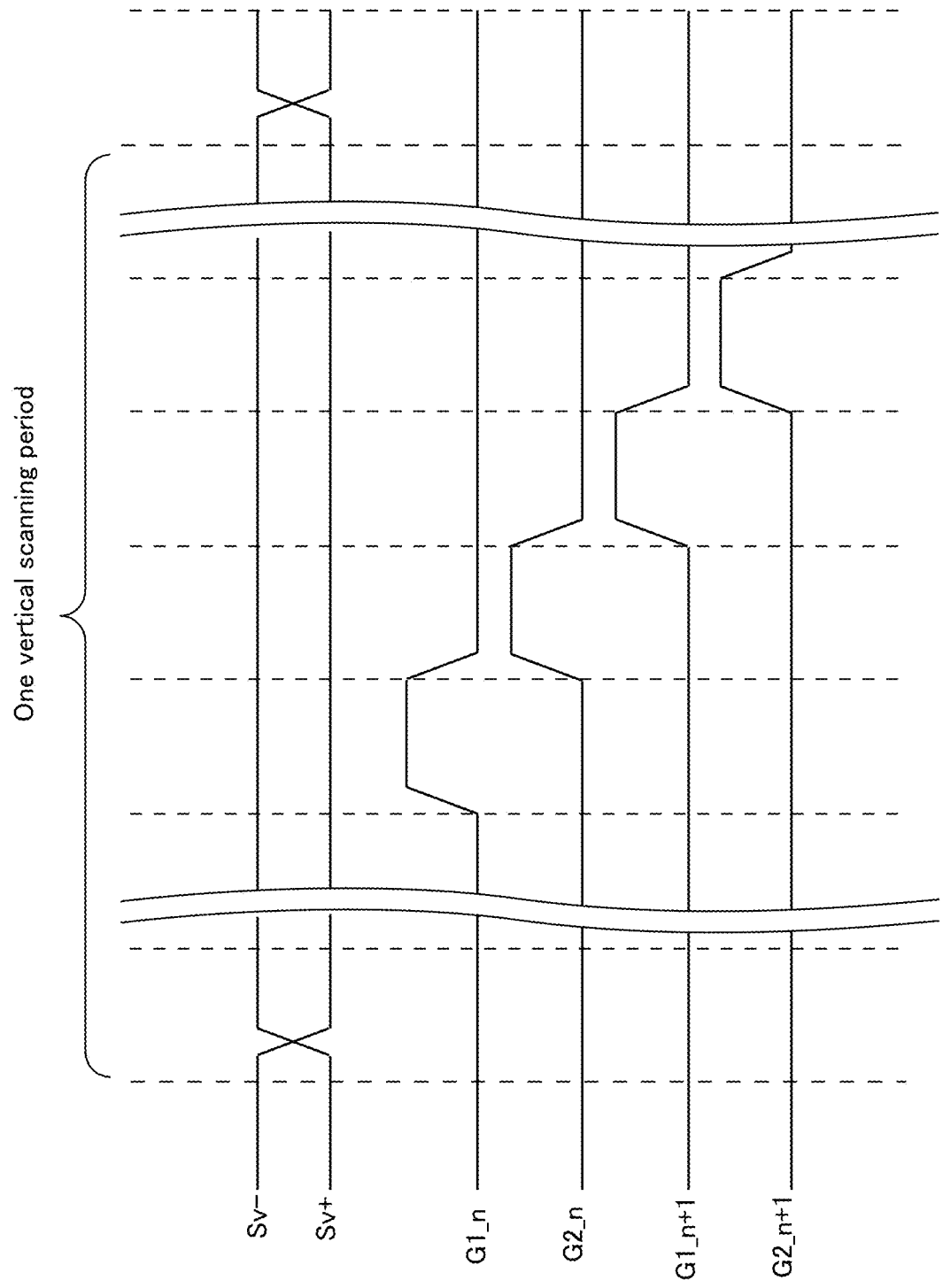
FIG. 8 is a timing chart showing timings for writing data in the pixel in Embodiment 2.

Incidentally, the data writing in this case is performed as follows. FIG. 8 is a timing chart showing timings for writing data in the pixel.

As shown in FIG. 8, the gate lines G1_n, G2_n, G1_n+1, and G2_n+1 are driven in this order, during every horizontal scanning period. To the source lines Sa to Sd, while each gate line G is being driven, a data signal voltage (Sv+, Sv−) to be written to the pixel in which the pixel electrode 120 connected to this gate line G is arranged is supplied. Incidentally, in FIG. 8, "Sv+" indicates a data signal voltage having a positive polarity with reference to the potential of the common electrode, and "Sv−" indicates a data signal voltage having a negative polarity with reference to the potential of the common electrode. In this example, therefore, data are written to the pixels in the following order: the pixels where the pixel electrodes 121a to 121d are provided; the pixels where the pixel electrodes 122a to 122d are provided; the pixels where the pixel electrodes 123a to 123d are provided; and the pixels where the pixel electrodes 124a to 124d are provided.

Incidentally, in the present example, two gate lines G are provided with respect to one row of pixels, and data are written to two columns of pixels with one source line S. Therefore, the gate lines G and the source lines G are driven at a double speed, as compared with a case where one gate line G is provided with respect to one row of the pixels and data are written to one column of pixels with one source line S.

In the present embodiment, it is easier to connect the pixel electrodes 120 and the source lines S according to the polarities of the pixel voltages of the pixels where these pixel electrodes 120 are provided, since the connection portions 120b of the pixel electrodes 120 extend to the pixels adjacent in the gate line G extending direction. Dot inversion driving therefore can be achieved by inverting the polarity of a data signal voltage supplied to the source line S every vertical scanning period, which makes it possible to prevent the deterioration of the display quality, while reducing electric power consumption. Besides, in the present embodiment, it is possible to write data in pixels in two columns with use of one source line S, thereby making it possible to reduce the number of the source lines S into half, as compared with a case where data are written in pixels in one column with use of one source line S. Therefore, it is possible to reduce the number of the source drivers for driving the source lines S.

Modification Example 1

The display panel in Embodiment 2 may be applied in a display panel equipped with a touch panel. The following description describes a case where the same is applied in a display panel equipped with a touch panel.

A display panel 2 in the present modification example includes a touch sensor mechanism that has a function of displaying an image, and a touch detecting function for detecting information of a position (touch position) at which a user makes input based on the displayed image. In other words, in this example, the display panel 2 is a so-called full-in-cell type touch-panel-equipped display device in the inside of which a touch sensor mechanism (such as electrodes and lines for detecting a touch) are provided.

In the display panel 2 according to the present modification example, liquid crystal molecules included in a liquid crystal layer (not shown) are driven by the horizontal electric field driving method. To realize the horizontal electric field driving method, pixel electrodes and common electrodes for forming electric fields for driving liquid crystal are formed on the active matrix substrate 10.

Figure 9:
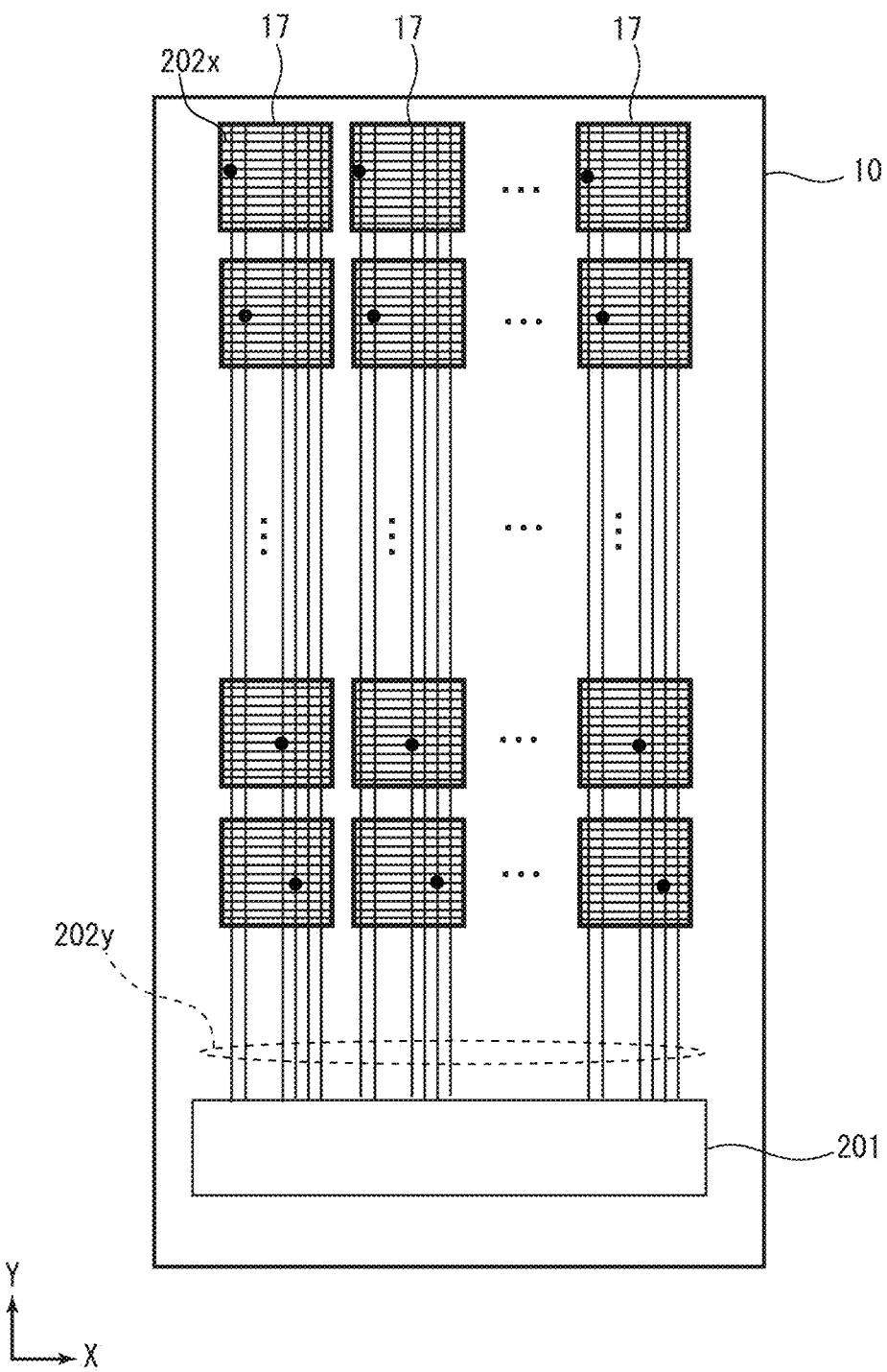
FIG. 9 is a schematic diagram showing an exemplary arrangement of common electrodes formed on an active matrix substrate in Modification Example 1 of Embodiment 2.

FIG. 9 schematically shows an exemplary arrangement of common electrodes formed on the active matrix substrate 10 in the present modification example. Incidentally, in FIG. 9, for convenience sake, the illustration of elements such as the gate lines G, the source lines S, the pixel electrodes 120, and the pixel TFTs 12 is omitted, but these elements are arranged on the active matrix substrate 10, as is the case with Embodiment 2.

The common electrodes 17 are formed on a surface on the liquid crystal layer (not shown) side of the active matrix substrate 10. As shown in FIG. 9, the common electrode 17 is in a rectangular shape, and a plurality of the common electrodes 17 are arranged in matrix on the active matrix substrate 10 so as to be opposed to the pixel electrodes 120 (see FIG. 7 and the like). Further, slits (not shown) for causing horizontal electric fields to be generated between the common electrodes 17 and the pixel electrodes 120 (see FIG. 7 and the like) are formed in the common electrodes 17.

On the active matrix substrate 10, a controller 201 is provided. The controller 201 performs a controlling operation for displaying an image, and performs a controlling operation for detecting a touch position.

Besides, on the active matrix substrate 10, a plurality of signal lines 202x extending in the X-axis direction and a plurality of signal lines 202y extending in the Y-axis direction are provided so as to overlap with the common electrodes 17. Of the plurality of signal lines 202 that overlap with the common electrodes 17, one of the signal lines 202y is connected with the common electrode 17, and the common electrode 17 is connected with the controller 201 through the signal line 202y connected therewith.

The common electrode 17 in pair with the pixel electrode 11 is used during the controlling operation for displaying an image, and is also used during the controlling operation for detecting a touch position.

Regarding the common electrode 17, parasitic capacitances are formed between the same and adjacent ones of the common electrodes 17 or the like. When a human finger, a touch pen, or the like touches the display screen, capacitors are formed between the common electrodes 17 and the human finger or the like, and thereby electrostatic capacitances of the common electrodes 17 increase. During the control for touch position detection, the controller 201 supplies a touch driving signal to the common electrodes 17 through the signal lines 202y, and receives a touch detection signal through the signal lines 202y. By doing so, the controller 201 detects changes in the electrostatic capacitances in the common electrodes 17, and detects a touch position.

Figure 10:
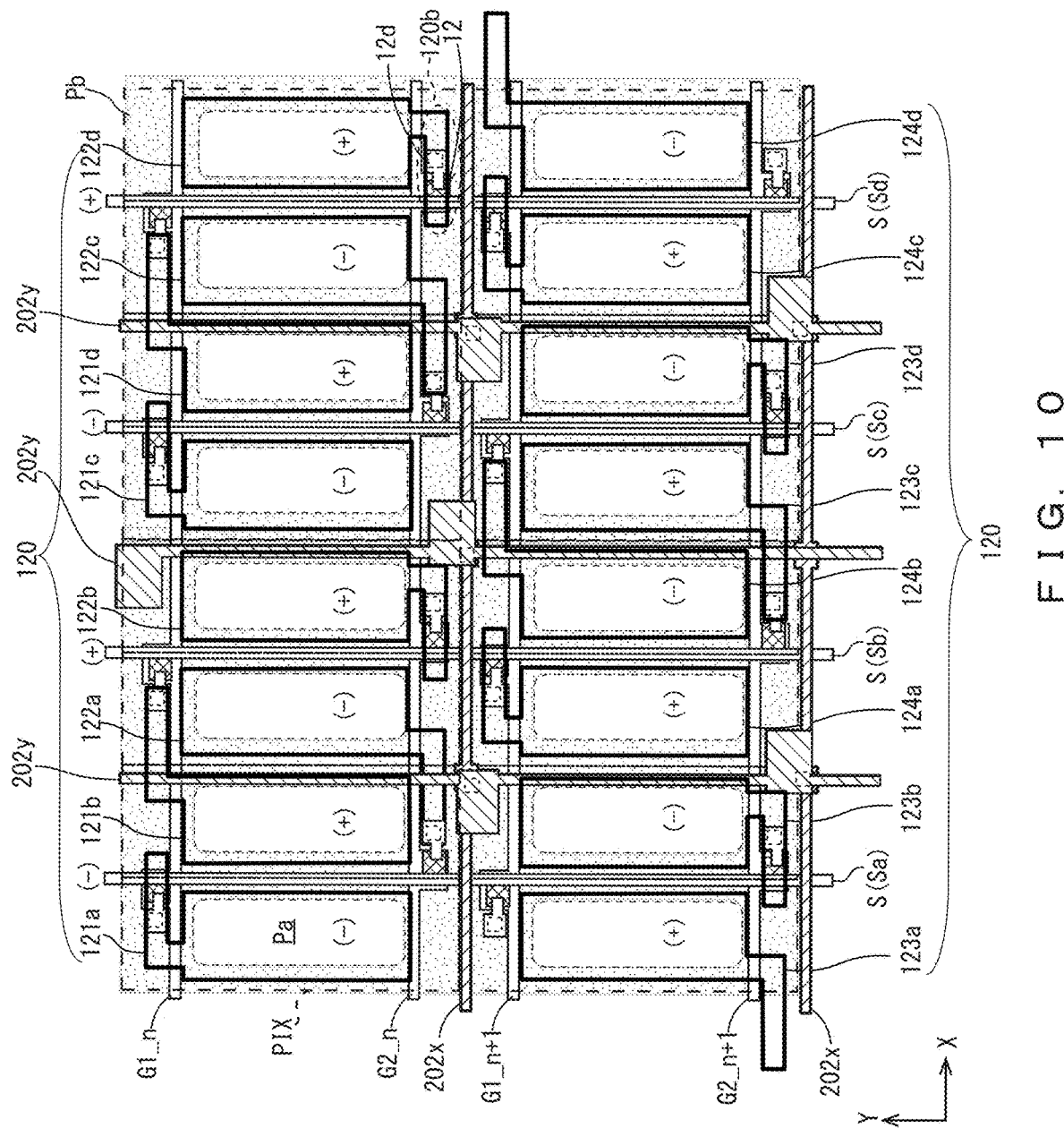
FIG. 10 is a schematic diagram showing a schematic configuration of an active matrix substrate on which signal lines shown in FIG. 9 are provided.

FIG. 10 schematically shows a schematic configuration of an active matrix substrate wherein signal lines 202x, 202y are provided in the pixels. Incidentally, in FIG. 10, members identical to those in Embodiment 2 are denoted by the same reference symbols in Embodiment 2. The following description describes configurations different from those in Embodiment 2.

As shown in FIG. 10, the signal line 202y approximately in parallel with the source lines S is provided in the light-shielding area Pb between the pixel electrodes 121*b*, 123*b* and the pixel electrodes 122*a*, 124*b*. Likewise, the signal lines 202*y* are provided in the light-shielding area Pb between the pixel electrodes 122*b*, 124*b* and the pixel electrodes 121*c* and 123*c*, as well as between the pixel electrodes 121*d*, 123*d* and 122*c* and 124*c*. Further, the signal line 202*x* approximately in parallel with the gate lines G is provided in the light-shielding area Pb between the gate line G2_*n* and the gate line G1_*n*+1. The signal lines 202*x* and 202*y* intersect with each other, and are connected with each other via a contact at the intersection positions.

In this example, as one source line S is provided with respect to pixels in two columns, it is easier to arrange the signal lines 202*y* in the light-shielding area Pb between the source lines S, as compared with a case where one source line S is provided with respect to pixels in one column. Besides, as two gate lines G are provided with respect to pixels in one row, it is easier to arrange the signal lines 202*x* in the light-shielding area Pb between the gate lines G, as compared with a case where one gate line G is provided with respect to pixels in one row. Besides, by arranging the signal lines 202*x* and 202*y*, the resistance of the common electrodes 17 can be reduced, and the S/N ratio of the touch sensor mechanism can be improved.

Embodiment 3

The present embodiment is described with reference to another exemplary configuration in the case where the signal lines 202*x* and 202*y* in Modification Example 1 of Embodiment 2 are arranged in the pixels.

FIG. 11 schematically shows an exemplary configuration of pixels in the present embodiment. In FIG. 11, members identical to those in Modification Example 1 described above are denoted by the same reference symbols in Modification Example 1. The following description describes configurations different from those in Modification Example 1.

As shown in FIG. 11, in the present embodiment, the pixel electrodes 131A to 134A are connected to the gate line Gn, and the pixel electrodes 131B to 134B are connected to the gate line Gn+1. In the following description, the pixel electrodes 131A to 134A, 131B to 134B are generally referred to as "pixel electrodes 130" when they are not distinguished individually. In other words, in this example, the pixel electrodes 130 arranged in the same row are connected with the same gate line G, and N gate lines G (N: a natural number of 1 or more) are arranged in a case where N pixel electrodes 130 are arranged in the Y-axis direction.

Regarding the pixel electrodes 131A to 134A in the upper row and the pixel electrodes 131B to 134B in the lower row, the direction in which the connection portions 130*b* of the former connected with the pixel TFTs 12 extend, and the direction in which those of the latter extend, are opposite to each other.

The signal line 202*y* is arranged in the light-shielding area Pb between the pixel electrodes 132A, 132B and the pixel electrodes 133A, 133B, and the source lines S (S1 to S5) provided in the vicinity of the pixels for which the signal line 202*y* is provided are bent. Among the source lines S1 to S5, the source lines S1 and S4 are arranged so as to overlap with the non-light-shielding areas Pa of the pixels PIX.

The pixel electrodes 131A and 132B are connected via the source line S2 and the pixel TFTs 12, and the pixel electrodes 132A and 133B are connected via the source line S3 and the pixel TFTs 12. Further, the pixel electrodes 133A and 134B are connected via the source line S4 and the pixel TFTs 12. In other words, in this example, as is the case with Embodiment 1, the pixel electrodes 130 adjacent in the Y-axis direction are connected with different ones of the source lines S, respectively, the source lines S being arranged on the sides in the directions in which the connection portions 130*b* of the pixel electrodes 130 extend, respectively. In a case where M pixel electrodes 130 (M: a natural number of 1 or more) are arranged in the X-axis direction, M source lines S are arranged.

In this example, the data signal voltages supplied to the source lines S1, S3, S5 and the data signal voltages supplied to the source lines S2, S4 have polarities opposite to each other. In other words, for example, in a case where data signal voltages having a negative polarity (−) are supplied to the source lines S1, S3, and S5 in a certain frame, data signal voltages having a positive polarity (+) are supplied to the source lines S2 and S4. In this case, the pixel voltages at the pixel electrodes 131A, 132B, 133A, and 134B have a positive polarity (+), and the pixel voltages at the pixel electrodes 132A, 133B, and 134A have a negative polarity (−).

In this way, by arranging some of the source lines S in the non-light-shielding areas Pa, the signal lines 202*y* can be arranged in the light-shielding area Pb between the pixels. Besides, by bending some of the source lines S and extending the connection portions 130*b* of the pixel electrodes 130 to the light-shielding area Pb of the pixel adjacent thereto in the X-axis direction, the pixel electrode 130 can be easily connected with the source line S according to the polarity of the pixel electrode 130. Dot inversion driving therefore can be realized by inverting the polarity of the data signal voltages supplied to the source lines S every vertical scanning period, which makes it possible to prevent the deterioration of the display quality, while reducing electric power consumption. Further, as all the pixel TFTs 12 are connected to the source lines S in the same direction, it is possible to decrease the deterioration of the display quality such as vertical stripe that would be caused by the displacement between the gate layer and the source layer.

Incidentally, in this example, all of the source lines S1 to S5 are bent, but these source lines other than the source line S3, i.e., the source lines S1, S2, S4, and S5 may be straight. In other words, at least one source line S connected with the pixel electrode 130 of the pixel where the signal line 202*y* is arranged may be bent.

Embodiment 4

Embodiment 3 described above is described with reference to an example in which the signal line connected with the common electrode is arranged in the pixels, but the element arranged in the pixel is not limited to this. For example, gate drivers 40 (see FIG. 1) may be arranged within the pixels.

Figure 12:
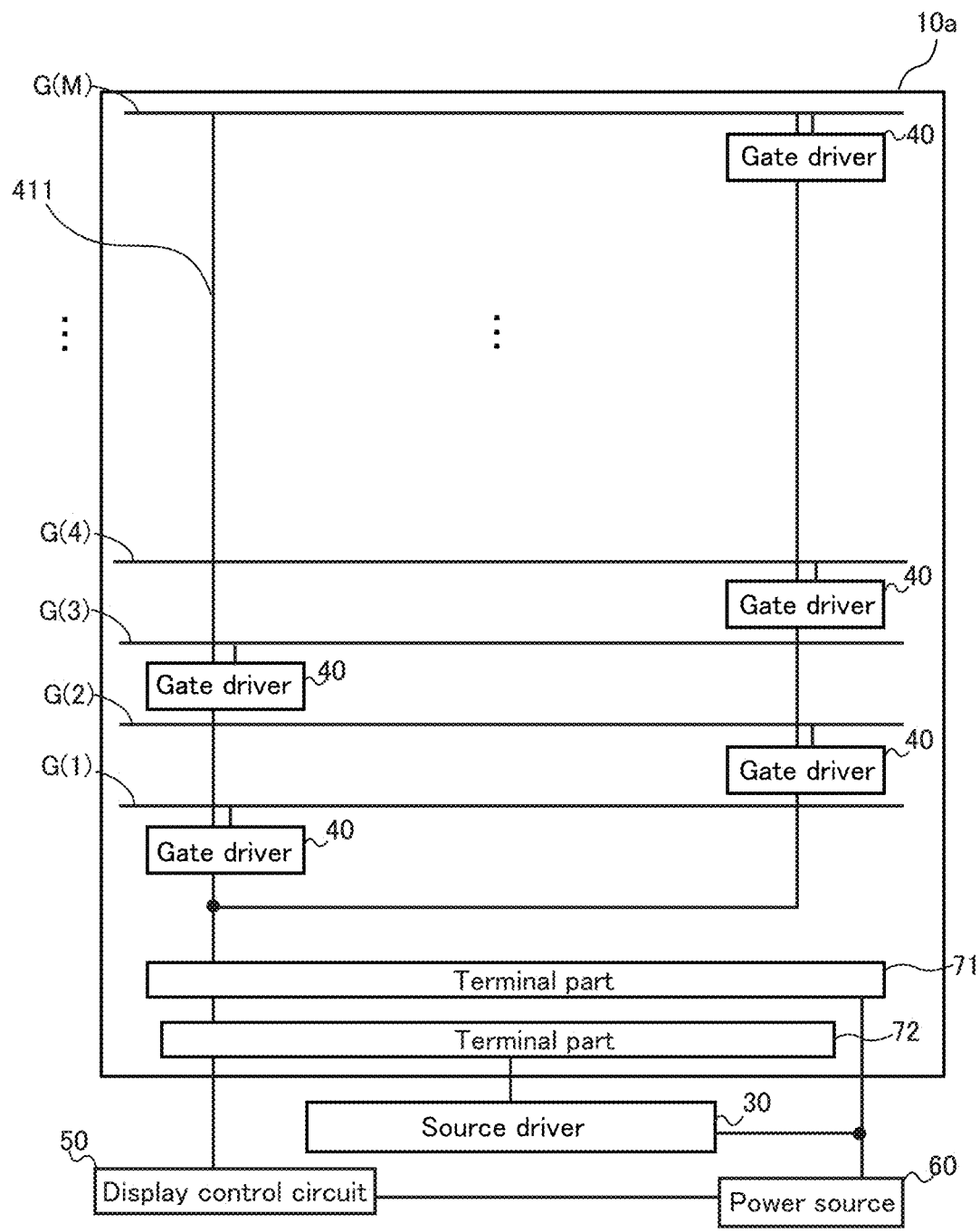
FIG. 12 is a schematic diagram showing an exemplary schematic arrangement of gate drivers on an active matrix substrate in Embodiment 4.

FIG. 12 schematically shows an exemplary schematic arrangement of gate drivers on an active matrix substrate 10 in the present embodiment. In FIG. 12, for convenience sake, the illustration of the source lines S is omitted.

As shown in FIG. 12 as an example, one gate driver 40 is provided with respect to each gate line G, and the gate driver 40 switches the gate line G corresponding thereto into a selected state or a non-selected state.

Each gate driver 40, except for the gate driver 40 for driving the gate line G(1) in the first row, is arranged between the gate line G corresponding thereto and the gate line G adjacent to the foregoing gate line G.

Further, in this example, the gate drivers 40 corresponding to the odd-numbered gate lines G (G(1), G(3), G(5), . . . ) are connected with one another via control lines 411. The gate drivers 40 corresponding to the even-numbered gate lines G (G(2), G(4), G(6), . . . ) are connected with one another via control lines 411.

On the active matrix substrate 10, in a frame region on a side where the source driver 30 is provided, terminal parts 71 and 72 are provided. The terminal part 71 is connected with the display control circuit 50 and the power source 60. Further, the terminal part 72 is connected with the display control circuit 50, the source driver 30, and the source lines S (see FIG. 2).

The display control circuit 50 supplies, as control signals, a signal whose potential repeatedly changes between an H level (VDD) and an L level (VSS) at a certain cycle (hereinafter referred to as a clock signal), and a signal having a potential at the same level as the H level of the clock signal (hereinafter referred to as a reset signal) to the terminal part 71.

The power source 60 supplies the power source voltage signal to the source driver 30 and the terminal part 71.

The terminal part 71 receives signals supplied thereto such as the control signals and the power source voltage signal, and supplies the signals to each gate driver 40 via the control lines 411. The gate driver 40 outputs a voltage signal indicating either one of the selected state and the non-selected state, to the gate line G corresponding thereto, according to the signals supplied thereto. The source driver 30 outputs data signals to each source line S (see FIG. 2) via the terminal part 72, according to the signals input from the display control circuit 50.

Next, the configuration of the gate driver 40 is described. FIG. 13 shows an exemplary equivalent circuit of the gate driver 40(*n*) that drives the gate line G(n).

As shown in FIG. 13, the gate driver 40(*n*) includes thin film transistors (TFTs) denoted by alphabetic characters A to E (hereinafter referred to as TFTs-A to -E) as switching elements, a capacitor Cbst, and a netA as an internal line in the gate driver 40.

The drain terminal of the TFT-B is connected to the gate line G(n−1) in the previous stage, the gate terminal thereof is connected to the control line 411 that supplies the clock signal CKB, and the source terminal thereof is connected to netA. The TFT-B controls the increase/decrease of the potential of the netA, according to the potentials of the clock signal CKB and the gate line G(n−1).

The drain terminal of the TFT-A is connected to the netA, the gate terminal thereof is connected to the control line 411 that supplies the reset signal CLR, and the source terminal thereof is connected to the control line 411 that supplies the power source voltage signal VSS. The TFT-A decreases the potential of the netA to the level of the power source voltage signal VSS, at a timing designated by the reset signal CLR.

The gate terminal of the TFT-E is connected to the netA, the drain terminal thereof is connected to the control line 411 that supplies the clock signal CKA, and the source terminal thereof is connected to the gate line G(n).

The drain terminal of the TFT-D is connected to the gate line G(n), the gate terminal thereof is connected to the control line 411 that supplies the reset signal CLR, and the source terminal thereof is connected to the control line 411 that supplies the power source voltage signal VSS.

The drain terminal of the TFT-C is connected to the gate line G(n), the gate terminal thereof is connected to the control line 411 that supplies the clock signal CKB, and the source terminal thereof is connected to the control line 411 that supplies the power source voltage signal VSS.

Regarding the capacitor Cbst having two electrodes, one of electrodes thereof is connected with netA(n), and the other electrode thereof is connected with the gate line G(n). The capacitor Cbst raises the potential of the netA(n) according to the potential of the clock signal CKA output from the TFT-E.

Incidentally, the connection of the clock signals CKA and CKB is alternated for the gate line G(n+1) in the next stage and the gate line G(n−1) in the previous stage. For example, in the next stage and the previous stage, the drain terminal of the TFT-E is connected with the control line 411 that supplies the clock signal CKB, and the gate terminals of the TFT-B and the TFT-C are connected with the control line 411 that supplies the clock signal CKA.

The reset signal CLR is, for example, a signal that is at the H level for a certain set period before the scanning of the gate line G is started, and in this case, the reset signal CLR rises to the H level every vertical scanning period. The rise of the reset signal CLR to the H level causes netA and the gate line G to be reset to the L level (the level of the power source voltage signal VSS). Further, at the start of one vertical scanning period, to the gate line G(1) in the first stage, a gate start pulse (GSP) is input as a set signal St from the display control circuit 50.

Figure 14:
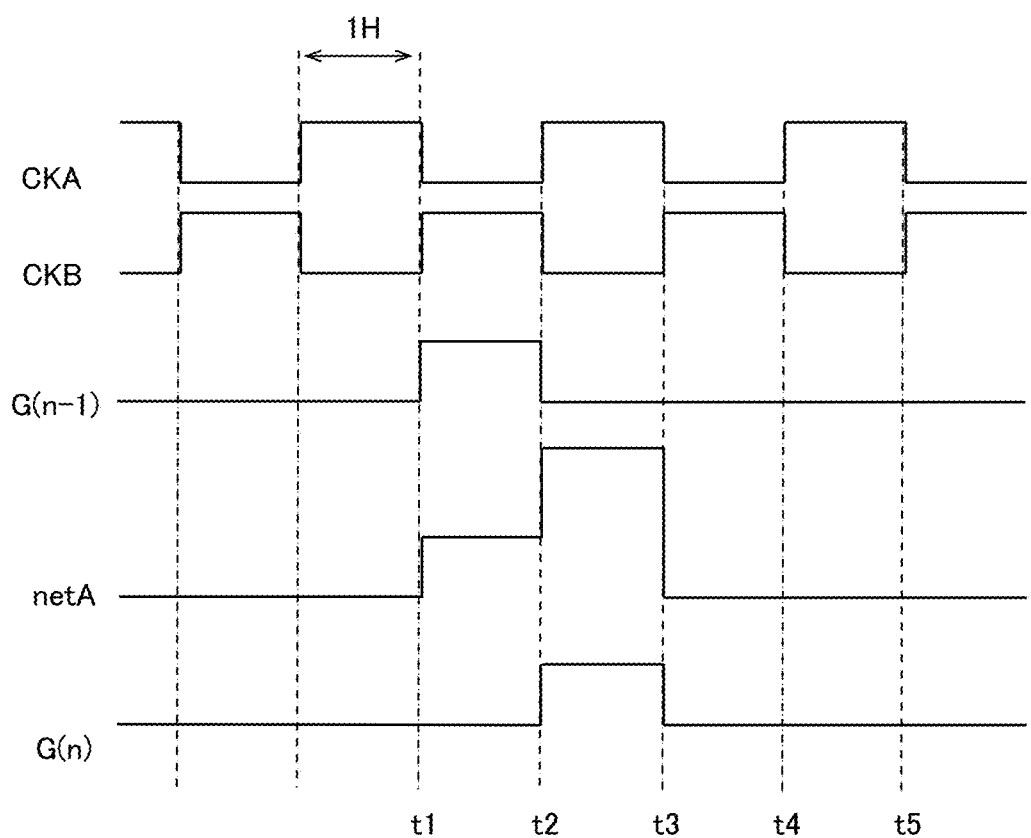
FIG. 14 is a timing chart showing timings when the gate driver shown in FIG. 13 drives a gate line.

The following description describes an operation performed when the gate driver 40(*n*) drives the gate line G(n). FIG. 14 is a timing chart showing timings when the gate driver 40(*n*) drives the gate line G(n). As shown in FIG. 14, the clock signals CKA and CKB alternately have a potential at the H level and a potential at the L level every horizontal scanning period (1H) repeatedly in such a manner that the clock signals CKA and CKB have phases opposite to each other, respectively.

At time t1, when the gate line G(n−1) in the previous stage becomes selected, the clock signal CKA shifts to the L level, and the clock signal CKB shifts to the H level. This causes the TFT-B to be turned ON, then causes the potential at the H level of the gate line G(n−1) to be input to the drain terminal of the TFT-B, thereby causing the netA to be charged to the H level. Besides, the TFT-E is turned OFF, which causes the potential of the netA to be maintained without decreasing. During this period, the TFT-C is in the ON state, which causes the gate line G(n) to have a potential at the L level.

At time t2, the clock signal CKA rises to the H level and the clock signal CKB falls to the L level, which causes the TFT-E to be turned ON and causes the TFT-C to be turned OFF. As the capacitor Cbst is provided between the netA and the gate line G(n), the netA is charged to a potential higher than the H level of the clock signal CKA, as the potential of the drain of the TFT-F rises. During this period, the potential at the H level of the clock signal CKA is output to the gate line G(n). This causes the gate line G(n) to be selected, thereby causing the potential at the H level of the gate line G(n) to be output as a set signal St to the gate driver 40(*n*+1) for driving the gate line G(n+1) in the next stage.

At time t3, when the clock signal CKA shifts to the L level and the clock signal CKB shifts to the H level, the TFT-B is turned ON and the netA is charged to the L level. Besides, as the TFT-E is turned OFF and the TFT-C is turned ON, the gate line G(n) is charged to the L level, thereby being switched to the non-selected state. Thereafter, with the clock signal CKB and the TFT-C, the potential of the gate line G(n) is maintained at the L level.

Figure 15:
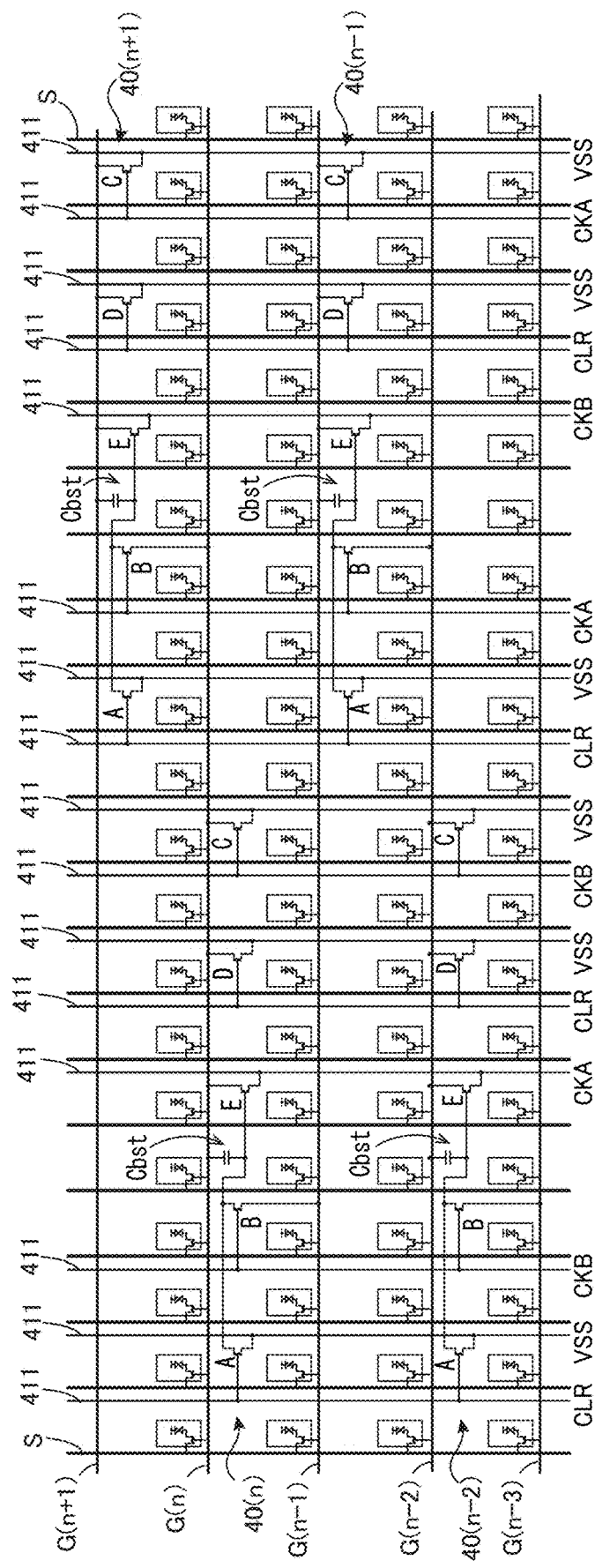
FIG. 15 is a schematic diagram showing an exemplary arrangement of circuit elements of the gate drivers shown in FIG. 12.

Next, an exemplary arrangement of circuit elements of the gate drivers 40 is described. FIG. 15 schematically shows an exemplary arrangement of the circuit elements of the gate drivers 40 in a case where the circuit elements are arranged in the pixels.

FIG. 15 shows an exemplary arrangement of the gate drivers 40(n−2) to 40(n+1) that drive the gate lines G(n−2) to G(n+1), respectively.

As shown in FIG. 15, each gate drivers 40 is arranged in a row between the gate line G driven by this gate driver 40 and the gate line G in the previous stage. Further, the gate driver 40(n−2) and the gate driver 40(n) are connected to each other via the control line 411 that is common to these gate drivers, and the gate driver 40(n−1) and the gate driver 40(n+1) are connected to each other via the control line 411 that is common to these gate drivers.

The circuit elements, i.e., the TFTs-A to -E denoted by the alphabetic characters A to E and the capacitor Cbst are arranged dispersedly in the different pixels of the same row. Here, the configuration of the pixels where the circuit elements of the gate drivers 40 and the control lines 411 are arranged is described specifically.

Figure 16:
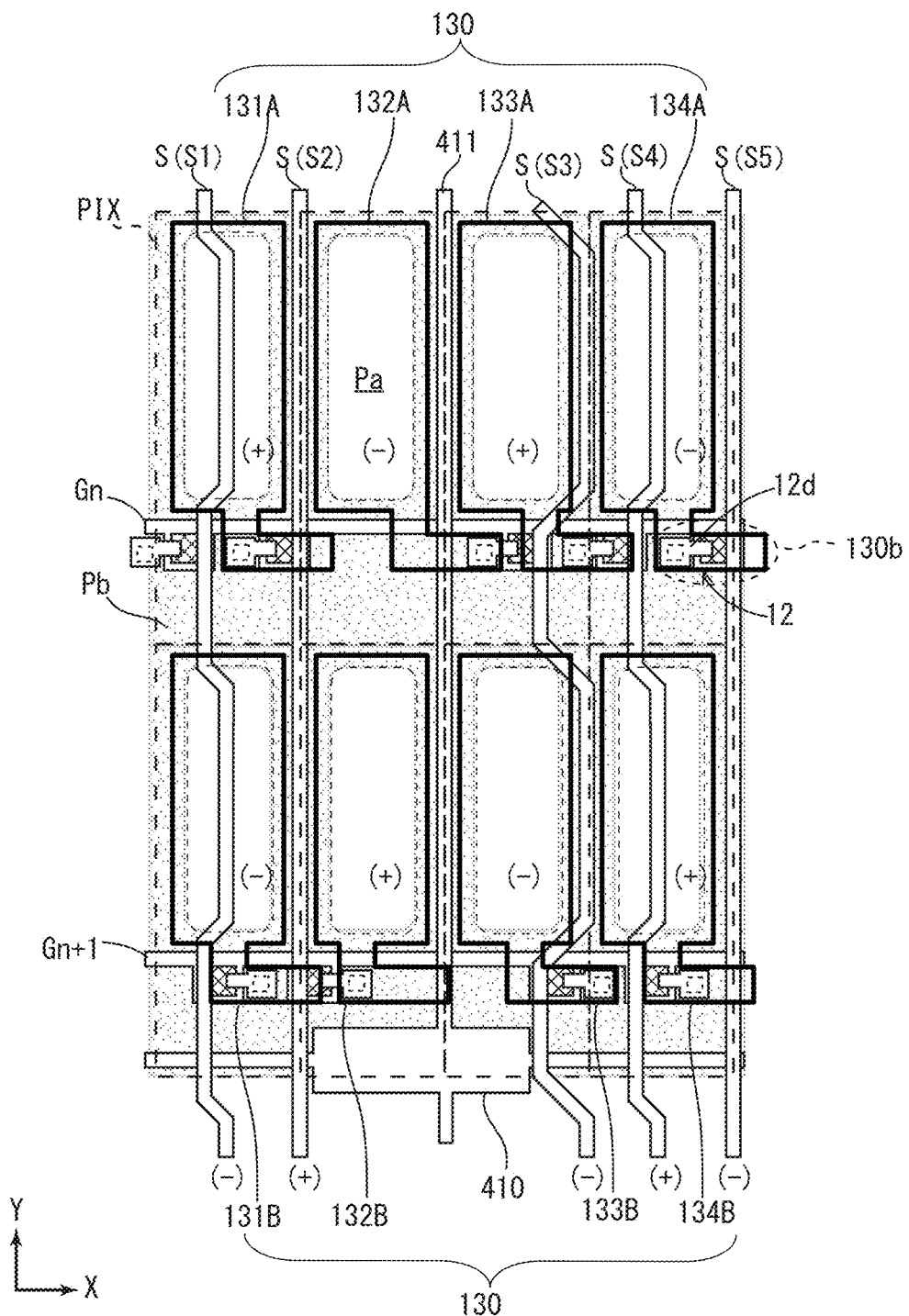
FIG. 16 is a schematic diagram showing an exemplary configuration of pixels where circuit elements of the gate driver and the control line shown in FIG. 12 are provided.

FIG. 16 schematically shows an exemplary configuration of pixels provided with circuit elements of the gate driver 40 and the control line 411. In this example, the circuit element 410 is provided extending over the light-shielding area of the pixels where the pixel electrodes 132B, 133B are provided; and the control line 411 connected with the circuit element 410 is provided in the light-shielding area Pb between the pixels where the pixel electrodes 132A, 132B are provided; and the pixels where the pixel electrodes 133A, 133B are provided. Further, among the source lines S1 to S5, the source lines S1, S3, and S4 are bent, and the source lines S1, S4 are arranged in the openings Pa.

All of the connection portions 130b of the pixel electrodes 130 extend in the same direction (the X-axis positive direction), and every pixel electrode 130 is arranged so as to extend over the boundary between the pixel of the same and the pixel adjacent in the X-axis positive direction.

In other words, each of the pixel electrodes 130 (131A to 134A) in the upper row is connected with the source line S arranged on a side in a direction in which the connection portion 130b of the pixel electrode 130 extends, while each of the pixel electrodes 130 (131B to 134B) in the lower row is connected with the source line S arranged on a side in the direction opposite to the connection portion 130b of the pixel electrode 130 extending direction. Regarding the pixel electrodes 130 in the upper row and the pixel electrodes 130 in the lower row, the direction in which the pixel TFTs 12 of the former are connected to the source lines S, and the direction in which those of the latter are connected to the source lines S, are opposite to each other.

Here, the source line S3 is connected with the pixel electrodes 132A, 133A where the circuit element 410 and the control line 411 are arranged. The source line S3 is arranged between the pixels where the pixel electrodes 133A, 133B are provided, and the pixels where the pixel electrodes 134A, 134B are arranged. Besides, the source line S3 is bent in such a manner that the source line S3 does not cross the opening Pa of the pixel, extends over the connection portion 130b of the pixel electrode 133B, and is close to the connection portion 130b of the pixel electrode 132b. This makes it possible to connect the connection portions 130b of the pixel electrodes 132A and 133B via the pixel TFTs 12 with the source line S3.

In other words, the connection portion 130b of the pixel electrode 130 is arranged so as to extend over the pixel adjacent thereto, and the source lines S are displaced so that a greater space is provided between some of the source lines S, whereby the circuit element 410 and the control lines 411 can be arranged in the pixels between the some of the source lines S. Further, the connection portion 130b of the pixel electrode 130 is arranged so as to reach the pixel that is adjacent thereto in the gate line G extending direction, and the source lines S thus displaced are bent. This makes it possible to connect the pixel electrode 130 of the pixel where the circuit element 410 and the control line 411 are provided, to the source line S corresponding to the polarity of the pixel voltage of this pixel electrode 130. Dot inversion driving therefore can be realized by performing polarity inversion of the data signal voltage supplied to the source line S every vertical scanning period, even in a case where the circuit elements 410 of the gate drivers 40, and the control lines 411 connected with the circuit elements 410, are arranged in the pixels. This makes it possible to decrease the deterioration of the display quality.

Incidentally, in this example, not only the source line S3, but also the source lines S1 and S4 are bent, but the source lines S1 and S4 may be straight. In other words, one source line S connected with the pixel electrode 130 of the pixel where the circuit element 410 and the control line 411 are provided may be bent.

Modification Example

In Embodiment 4 described above, regarding the pixel electrodes 130 in the upper row and the pixel electrodes 130 in the lower row, the direction in which the pixel TFTs 12 of the former are connected to the source lines S, and the direction in which those of the latter are connected to the source lines S, are opposite to each other. In other words, every row of the pixels, the direction in which the pixel TFT 12 is connected with the source line S is laterally inverted. Therefore, in a case where layer displacement occurs between the gate layer and the source layer, the amount of parasitic capacitance between the pixel electrode 130 and the gate line G varies by row. Consequently, in every row, differences are generated in the pull-in voltages of the pixel electrodes 130 when the pixel TFTs 12 are turned OFF, which makes it likely that horizontal strip would occur, thereby resulting in the deterioration of the display quality. The present modification example in Embodiment 4 is described with reference to a configuration for decreasing the deterioration of the display quality such as horizontal strip.

Figure 17:
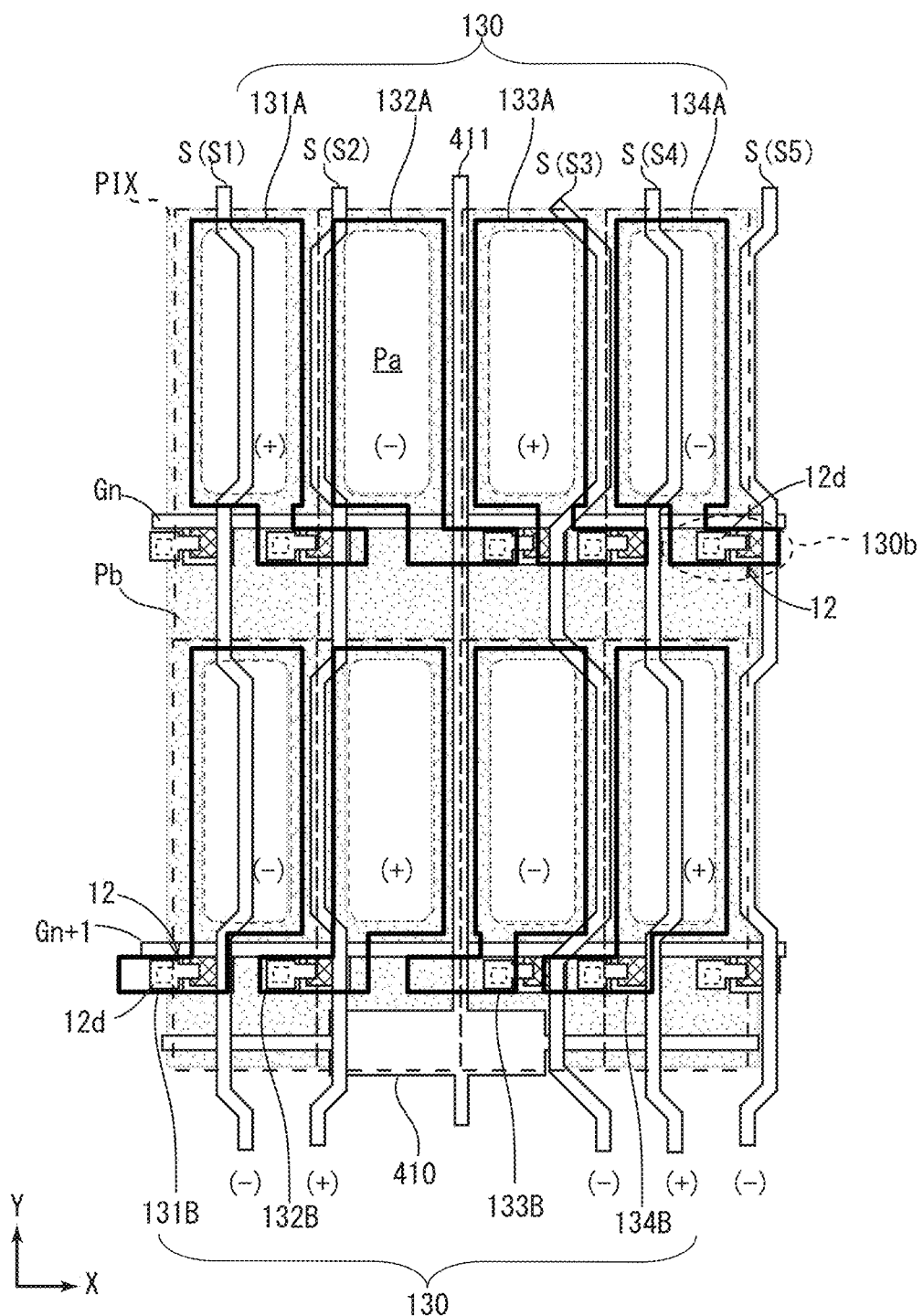
FIG. 17 is a schematic diagram showing an exemplary configuration of pixels in a modification example of Embodiment 4.

FIG. 17 schematically shows an exemplary configuration of pixels in the present modification example. In FIG. 17, members identical to those in Embodiment 4 are denoted by the same reference symbols in Embodiment 4. The following description describes configurations different from those in Embodiment 4.

In Embodiment 4 described above, all of the connection portions 130b of the pixel electrodes 130 extend in the same direction (the X-axis positive direction). In the present modification example, as shown in FIG. 17, the connection portions 130b of the pixel electrodes 131A to 134A in the upper row extend in the X-axis positive direction, while the connection portions 130b of the pixel electrodes 131B to 134B in the lower row extend in the X-axis negative direction.

Further, all of the drains 12d of the pixel TFTs 12 connected to the pixel electrodes 130 are arranged on the left side (the side in the X-axis negative direction) with respect to the source lines S to which the drains 12d are connected, and the pixel TFTs 12 are connected to the source lines S in the same direction. With this configuration, even if layer displacement occurs between the gate layer and the source layer, the amounts of parasitic capacitances between the pixel electrodes 130 and the gate lines G are approximately uniform, whereby the deterioration of the display quality can be decreased.

The embodiments of the present invention are described as above, but the above-described embodiments are merely examples for implementing the present invention. The present invention, therefore, is not limited to the above-described embodiments, and the above-described embodiments can be appropriately varied and any of the same can be implemented in combination, without departing from the spirit and scope of the invention.

Modification Example (1) The configuration of the gate driver 40 used in the above-described embodiments is one example; the configuration of the gate driver is not limited to this as long as the configuration includes a plurality of switching elements.

(2) As a semiconductor material for the pixel TFT 12 and the TFTs that compose the gate driver 40 in the above-described embodiments, amorphous silicon (a-Si), or low temperature poly-silicon (LTPS), may be used, but oxide semiconductor containing indium (In), gallium (Ga), zinc (Zn), and oxygen (O) is more preferable. By using oxide semiconductor containing indium (In), gallium (Ga), zinc (Zn), and oxygen (O), image definition enhancement and a greater aperture ratio can be achieved more easily, as compared with a case where amorphous silicon (a-Si), or low temperature poly-silicon (LTPS), is used.

The invention claimed is:

1. A liquid crystal display device comprising:
an active matrix substrate;
a counter substrate that is arranged so as to be opposed to the active matrix substrate;
a liquid crystal layer interposed between the active matrix substrate and the counter substrate; and
a circuit that supplies data signals to the active matrix substrate,
wherein the active matrix substrate includes:
a plurality of gate lines;
a plurality of source lines that intersect with the gate lines, and supply the data signals;
a plurality of pixels that are provided with pixel electrodes, respectively; and
pixel switching elements each of which is connected, in each of the pixels, with the pixel electrode of the said pixel, one of the gate lines, and one of the source lines,
wherein the pixel electrode has a connection portion that is connected with the pixel switching element,
the connection portion of the pixel electrode extends to an adjacent one of the pixels that is adjacent in a gate line extending direction to the pixel where the said pixel electrode is provided,
the data signal supplied by a source line has a polarity that is opposite to a polarity of a data signal supplied by a source line adjacent to the source line, and that is inverted every vertical scanning period, and
directions in which the connection portions of adjacent ones of the pixel electrodes that are adjacent in a source line extending direction extend are opposite to each other, and the connection portion of each pixel electrode is connected with the source line closest to the connection portion, among the source lines.

2. The liquid crystal display device according to claim 1, wherein the pixel electrodes of the pixels are arranged in matrix,
the source lines are aligned at intervals of two adjacent columns of the pixels in the gate line extending direction,
the gate lines are arranged in such a manner that two of the gate lines correspond to the pixel electrodes arranged in one same row, and adjacent ones of the pixel electrodes in the one same row that are adjacent with one of the source lines being interposed therebetween are connected to one same gate line of the said two gate lines, and
one of the two adjacent ones of the pixel electrodes between which one of the source lines is interposed is connected with the said one of the source lines, and the other one of the adjacent ones of the pixel electrodes is connected with another one of the source lines that is adjacent to the said one of the source lines.

3. The liquid crystal display device according to claim 2, further comprising:
a common electrode arranged so as to be opposed to the pixel electrodes of the pixels; and
a signal line connected with the common electrode,
wherein the signal line is arranged in a space between two columns of the pixels, no source line being arranged in the space.

4. The liquid crystal display device according to claim 1, further comprising:
driving circuits that are provided with respect to the gate lines, respectively, each driving circuit switching a corresponding one of the gate lines into a selected state or a non-selected state; and
a plurality of control lines that are connected with the driving circuits, respectively, and supply a control signal,
wherein the driving circuit includes a driving circuit element including a plurality of switching elements,
the driving circuit element is arranged in a plurality of the pixels that are adjacent in a the gate line extending direction,
one of the source lines connected with the pixel electrode of one of the pixels where the driving circuit element is provided is bent, and
the control line connected to the driving circuit element is arranged in a space between the pixels where the driving circuit element is arranged.

5. The liquid crystal display device according to claim 4, wherein the switching element as the driving circuit element contains an oxide semiconductor containing indium (In), gallium (Ga), zinc (Zn), and oxygen (O) as a semiconductor material.

6. The liquid crystal display device according to claim 1, wherein the pixel switching elements contain an oxide semiconductor containing indium (In), gallium (Ga), zinc (Zn), and oxygen (O) as a semiconductor material.

7. The liquid crystal display device according to claim 1, wherein drains of the pixel switching elements are arranged on the same side with respect to the source lines to which the pixel switching elements are connected, respectively.

* * * * *